(12) United States Patent
Woo et al.

(10) Patent No.: US 10,241,150 B2
(45) Date of Patent: Mar. 26, 2019

(54) SEMICONDUCTOR APPARATUS, STACK SEMICONDUCTOR APPARATUS, AND TEST METHOD OF THE STACK SEMICONDUCTOR APPARATUS

(71) Applicant: SAMSUNG ELECTRONICS CO., LTD., Suwon-si, Gyeonggi-do (KR)

(72) Inventors: Seung-han Woo, Seoul (KR); Reum Oh, Hwaseong-si (KR); Hae-suk Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 234 days.

(21) Appl. No.: 15/207,526

(22) Filed: Jul. 12, 2016

(65) Prior Publication Data
US 2017/0059648 A1    Mar. 2, 2017

(30) Foreign Application Priority Data
Aug. 31, 2015    (KR) .................... 10-2015-0123188

(51) Int. Cl.
| G01R 31/28 | (2006.01) |
| H01L 21/66 | (2006.01) |
| H01L 23/48 | (2006.01) |
| H01L 25/065 | (2006.01) |

(52) U.S. Cl.
CPC ..... *G01R 31/2884* (2013.01); *G01R 31/2856* (2013.01); *H01L 22/34* (2013.01); *H01L 23/481* (2013.01); *H01L 25/0657* (2013.01); H01L 2225/06541 (2013.01)

(58) Field of Classification Search
CPC ....... H01L 2225/06541; H01L 25/0657; H01L 23/481; H01L 22/34; G01R 31/2856; G01R 31/2884
USPC ......... 324/600, 500, 762.03–762.06, 763.01, 324/750.22, 757.05, 207.13
See application file for complete search history.

(56) References Cited

U.S. PATENT DOCUMENTS

| 4,617,475 A | 10/1986 | Reinschmidt |
| 8,095,841 B2 | 1/2012 | Kemmerling |
| 8,310,382 B2 | 11/2012 | Ide et al. |
| 8,384,417 B2 | 2/2013 | Laisne et al. |
| 8,436,639 B2 | 5/2013 | Goel |
| 8,514,641 B2 | 8/2013 | Cui et al. |
| 8,593,170 B2 | 11/2013 | Van Der Plas et al. |
| 8,698,276 B2 | 4/2014 | Lee et al. |
| 8,729,923 B2 | 5/2014 | Ramachandra |
| 8,743,582 B2 | 6/2014 | Kang et al. |
| 8,782,479 B2 | 7/2014 | Chakrabarty et al. |
| 8,890,607 B2 | 11/2014 | Huang et al. |
| 9,064,387 B2 * | 6/2015 | Bhatia ................ G06F 3/016 |
| 2013/0001548 A1 | 1/2013 | Jeong et al. |
| 2013/0157386 A1 | 6/2013 | Yun et al. |
| 2013/0230932 A1 | 9/2013 | Bringivijayaraghavan et al. |

(Continued)

*Primary Examiner* — Melissa J Koval
*Assistant Examiner* — Trung Q. Nguyen
(74) *Attorney, Agent, or Firm* — Lee & Morse, P.C.

(57) ABSTRACT

A semiconductor apparatus includes two or more semiconductor chips and a tester. The two or more semiconductor chips are electrically connected through one or more through-silicon vias (TSVs). The tester is on at least one of the two or more semiconductor chips and tests the state of at least one TSV based on an output signal of the TSV. The TSV is selected as a signal transmission TSV based on the state of the TSV.

15 Claims, 30 Drawing Sheets

(56) References Cited

U.S. PATENT DOCUMENTS

2013/0294184 A1 11/2013 Yang et al.
2016/0258996 A1* 9/2016 Lim .................... H05K 999/99

* cited by examiner

SEMICONDUCTOR APPARATUS, STACK SEMICONDUCTOR APPARATUS, AND TEST METHOD OF THE STACK SEMICONDUCTOR APPARATUS

CROSS-REFERENCE TO RELATED APPLICATION

Korean Patent Application No. 10-2015-0123188, filed on Aug. 31, 2015, and entitled, "Semiconductor Apparatus, Stack Semiconductor Apparatus, and Test Method of the Stack Semiconductor Apparatus," is incorporated by reference herein in its entirety.

BACKGROUND

1. Field

One or more embodiments described herein relate to a semiconductor apparatus, a stack semiconductor apparatus, and a test method of a stack semiconductor apparatus.

2. Description of the Related Art

Various attempts have been made to mount a high-capacity semiconductor memory in a small area (e.g., to achieve high integration) and, at the same time, efficiently drive such a memory. One attempt to increase integration involves a three-dimensional (3D) method of stacking a plurality of memory chips. One such method uses through-silicon via (TSV) technology. However, during fabrication, a TSV having an abnormal signal transmission state may be formed.

SUMMARY

In accordance with one or more embodiments, a semiconductor apparatus includes two or more semiconductor chips electrically connected through one or more through-silicon vias (TSVs); and a TSV tester on at least one of the two or more semiconductor chips, the TSV tester to test a state of each of the one or more TSVs based on a signal output through each of the one or more TSVs and to determine whether to use a TSV among the one or more TSVs as a signal transmission TSV based on the state of the TSV.

The TSV tester may include a TSV state sensor to generate a state signal corresponding to the state of each of the one or more TSVs based on a test output signal, the test output signal to be output when a test input signal to test each of the one or more TSVs passes through each of the one or more TSVs; and a TSV selector to select at least one of the one or more TSVs as the signal transmission TSV based on the state signal.

The TSV state sensor may determine whether each of the one or more TSVs is in a normal state based on whether signal types of the test input signal and the test output signal are equal. The test input signal may be a pulse signal, the TSV state sensor may determine whether the test output signal has a pulse shape equal to a pulse shape of the test input signal and is to generate a state signal of a first level when the pulse shapes of the test output signal and the test input signal are equal, and the TSV state sensor may generate a state signal of a second level when the pulse shape of the test output signal is different from the pulse shape of the test input signal. The TSV selector may select a TSV corresponding to the state signal of the first level from among the one or more TSVs as the signal transmission TSV.

The apparatus may include one or more auxiliary TSVs to transmit the signal instead of the TSV selected as the signal transmission TSV, wherein the TSV tester is to test the state of the TSV selected as the signal transmission TSV and switch between the TSV selected as the signal transmission TSV and an auxiliary TSV based on the state of the TSV selected as the signal transmission TSV.

In accordance with one or more other embodiments, a method for testing a stack semiconductor apparatus electrically connected through one or more through-silicon vias (TSVs) includes applying a test input signal, to test each of the one or more TSVs, to each of the one or more TSVs; generating a state signal of each of the one or more TSVs based on a test output signal output when the test input signal passes through each of the one or more TSVs; and determining to select a TSV from among the one or more TSVs as a signal transmission TSV of the stack semiconductor apparatus based on the state signal.

Generating the state signal of each of the one or more TSVs may include monitoring the test output signal; and determining whether each of the one or more TSVs is in a normal state based on a comparison of signal types of the test input signal and the test output signal. Determining whether each of the one or more TSVs is in a normal state may include determining whether the signal types of the test output signal and the test input signal are equal, and generating the state signal of each of the one or more TSVs includes generating a state signal indicating a normal state when the signal types of the test output signal and the test input signal are equal. Determining whether to select the TSV from among the one or more TSVs as the signal transmission TSV may include selecting a TSV corresponding to the state signal indicating the normal state as the signal transmission TSV.

When a TSV among the one or more TSVs is determined to be in an abnormal state based on a comparison of the signal types of the test input signal and the test output signal, the method may include generating a TSV blocking signal to block signal transmission through the TSV determined to be in the abnormal state; and blocking the TSV determined to be in the abnormal state based on the TSV blocking signal.

The method may include receiving a power-on signal; and generating a test command to test each of the one or more TSVs based on the power-on signal. The method may include applying the test input signal to the TSV selected as the signal transmission TSV; monitoring the test output signal output when the test input signal passes through the TSV selected as the signal transmission TSV; and determining whether the TSV selected as the signal transmission TSV is in a normal state based on a comparison of signal types of the test input signal and the test output signal output through the TSV selected as the signal transmission TSV.

The one or more TSVs may include auxiliary TSVs, and the method may include, when the TSV selected as the signal transmission TSV is in an abnormal state, selecting, instead of the TSV selected as the signal transmission TSV, an auxiliary TSV from among the auxiliary TSVs as the signal transmission TSV. The method may include generating a level fixing signal based on the state signal; and fixing a level of the state signal to a previous level based on the level fixing signal.

In accordance with one or more other embodiments, a semiconductor apparatus includes first and second through-silicon vias (TSVs); and a tester to select the second TSV as a signal transmission TSV when the first TSV is in an abnormal state, wherein the first and second TSVs electrically connect two semiconductor chips. The tester may test a state of the first TSV based on a signal output from the first TSV. The tester may determine that the first TSV is in the abnormal state when the signal output from the first TSV is different from a test signal input into the first TSV. The tester may determine that the first TSV is in the abnormal state when a shape or level of the signal output from the first TSV is different from a shape or level of the test signal input into the first TSV.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
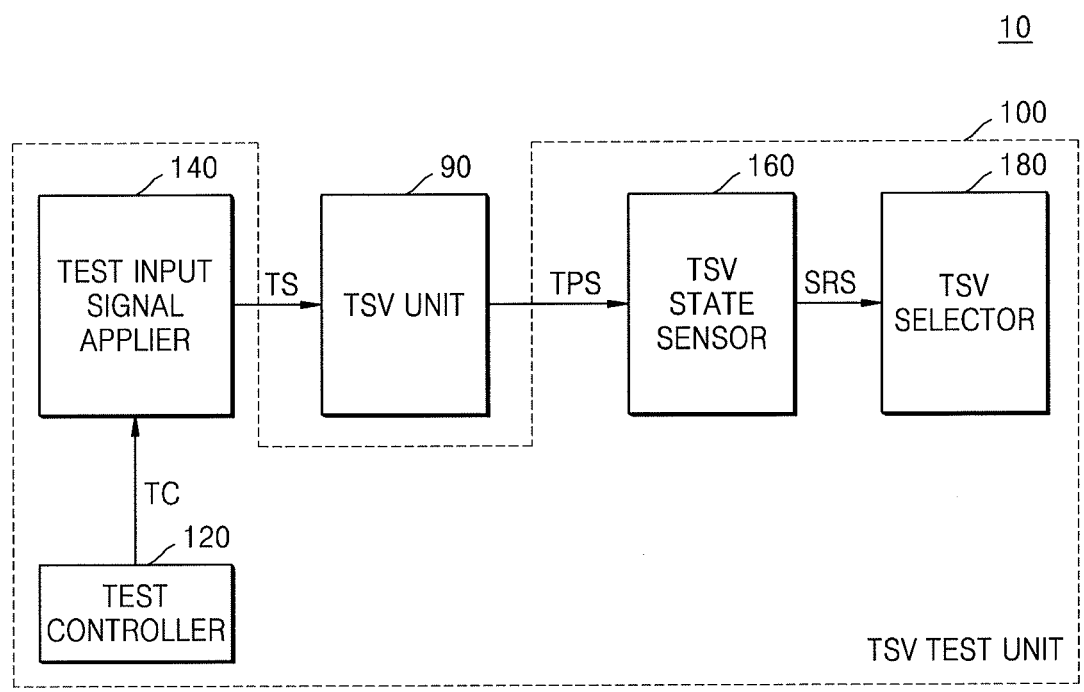
FIG. 1 illustrates an embodiment of a semiconductor apparatus.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing exemplary embodiments only and is not intended to be limiting of exemplary embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, components, or combinations thereof, but do not preclude the presence or addition of one or more other features, integers, steps, operations, elements, components, or combinations thereof.

It will be understood that, although the terms first, second, third etc. may be used herein to describe various elements, these elements should not be limited by these terms. These terms are only used to distinguish one element from another element. Thus, a first element discussed below could be termed a second element without departing from the teachings of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly defined herein.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

As used herein, the term "and/or" includes any and all combinations of one or more of the associated listed items. Expressions such as "at least one of" when preceding a list of elements, modify the entire list of elements and do not modify the individual elements of the list.

FIG. 1 illustrates an embodiment of a semiconductor apparatus 10 which includes a through-silicon via (TSV) unit 90 and a TSV test unit 100. The TSV test unit 100 includes a test controller 120, a test input signal applier 140, a TSV state sensor 160, and a TSV selector 180.

The TSV unit 90 may be electrically connected to one or more semiconductor chips and may transmit a signal between a controller and the semiconductor apparatus 10 including the semiconductor chips. The TSV unit 90 may include two or more TSVs, each functioning as a signal transmission TSV. The signal transmission TSV may be part of a signal transmission line through which a signal is transmitted between the controller and the semiconductor apparatus 10. The signal may include at least one of a data signal input from the controller, a data signal output from the semiconductor apparatus 10, or a test input signal TS output from the TSV test unit 100.

When one of the TSVs in the TSV unit 90 is abnormal due to various factors in a manufacturing process, a resistance value or a capacitance value of the abnormal TSV may be greater than a resistance value or a capacitance value of a TSV that is normal. Accordingly, the abnormal TSV may not be suitable as a signal transmission TSV.

In one embodiment, the TSV test unit 100 may be in the semiconductor apparatus 10 to serve as a built-in self-test (BIST) circuit for testing the semiconductor apparatus 10 without an additional external test device. The TSV test unit 100 may apply a test input signal TS to the TSV unit 90, sense a signal transmission state of each TSV in the TSV unit 90, and select a TSV having a good signal transmission state as a signal transmission TSV.

The test controller 120 may control a test operation for testing the signal transmission state of each TSV of the TSV unit 90. When the test controller 120 receives a power-on signal (e.g., from an external source) for operating the semiconductor apparatus 10, the test controller 120 may control performance of a test operation. In one embodiment, the test controller 120 may control performance of a test operation in a predetermined cycle. The test controller 120 may receive a test start signal (e.g., from an external source) and control a test operation to be performed. The test controller 120 may generate a test command TC and apply the test command TC to the test input signal applier 140.

When the test input signal applier 140 receives the test command TC from the test controller 120, the test input signal applier 140 may apply the test input signal TS to the TSV unit 90 for testing a signal transmission state of each TSV in the TSV unit 90. The test input signal TS may be, for example, a pulse signal having a predetermined duty ratio. The TSV unit 90 may receive the test input signal TS, and the test input signal TS may pass through each TSV of the TSV unit 90 and may be applied as a test output signal TPS to the TSV state sensor 160 and the TSV selector 180.

For example, when the test input signal TS is a pulse signal having a predetermined duty ratio which passes through a TSV having a normal signal transmission state, the test output signal TPS may have a pulse shape that is the same as the test input signal TS. When the test input signal TS passes through a TSV having an abnormal signal transmission state, the test output signal TPS may have a pulse shape different from the test input signal TS. For example, the test output signal TPS may be a low-level signal.

The TSV state sensor 160 may sense a signal transmission state of each TSV in the TSV unit 90. The TSV state sensor 160 may generate a state signal SRS indicating the signal transmission state of each TSV in the TSV unit 90 based on the test output signal TPS output from the TSV unit 90. For example, when the test input signal TS is a pulse signal, the state signal SRS may be generated by determining whether the test output signal TPS has a pulse shape that is the same as the test input signal TS. For example, when the test output signal TPS has a pulse shape that is the same as the test input signal TS, the state signal SRS of a first level may be generated indicating that a TSV is in a normal state. When the test output signal TPS has a pulse shape different from the test input signal TS, the state signal SRS of a second level may be generated indicating that a TSV is in an abnormal state.

The TSV selector 180 may select at least one TSV corresponding to a normal state as a signal transmission TSV in the TSV unit 90. The selection may be based on the state signal SRS of each TSV. For example, when the TSV selector 180 receives the state signal SRS of the first level indicating that a TSV is in a normal state, the TSV selector 180 may select the TSV in the normal state corresponding to the state signal SRS of the first level as a signal transmission TSV. When the TSV selector 180 receives the state signal SRS of the second level indicating that a TSV is in an abnormal state, the TSV selector 180 may not select the TSV in the abnormal state corresponding to the state signal SRS of the second level as a signal transmission TSV. Accordingly, when a data signal from the controller is transmitted into the semiconductor apparatus 10 after a test operation is completed, the data signal may be transmitted through the TSV selected as the signal transmission TSV.

According to the present exemplary embodiment, semiconductor apparatus 10 may test each TSV on its own without an additional external test device, may select only a TSV in a normal state as a signal transmission TSV, and may transmit a signal through the signal transmission TSV, thereby accurately and efficiently transmitting the signal.

Figure 2:
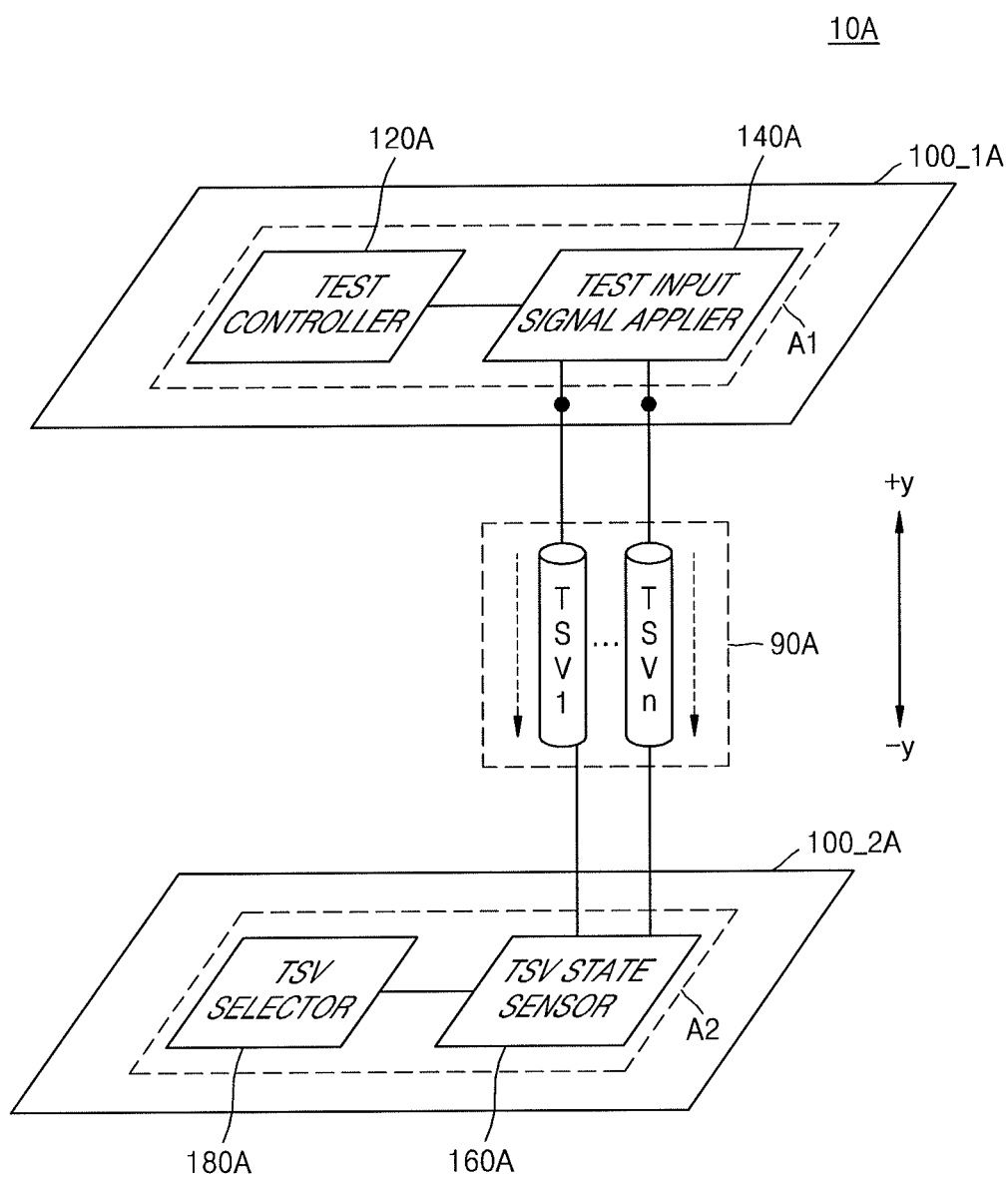
FIG. 2 illustrates an embodiment of a semiconductor apparatus.

FIG. 2 illustrates an embodiment of a semiconductor apparatus 10A including a TSV test unit 100, for example, as in FIG. 1. Referring to FIG. 2, the semiconductor apparatus 10A includes a first semiconductor chip 100_1A, a second semiconductor chip 100_2A, and a TSV unit 90A. First through nth TSVs TSV1 through TSVn of the TSV unit 90A may be formed as physical wiring lines passing between the first semiconductor chip 100_1A and the second semiconductor chip 100_2A. The first semiconductor chip 100_1A and the second semiconductor chip 100_2A may transmit a signal therebetween through the TSV unit 90A.

The first semiconductor chip 100_1A may include a test controller 120A to control a test operation in a first signal direction and a test input signal applier 140A to apply a first test input signal for testing a signal transmission state of each of the first through Nth TSVs TSV1 through TSVn of the TSV unit 90A in the first signal direction. For example, the first signal direction may be a −y direction. The signal transmission state of the TSV unit 90A may be tested by applying the first test input signal from the first semiconductor chip 100_1A to the second semiconductor chip 100_2A. (A configuration including the test controller 120A and the test input signal applier 140A may be referred to as a first partial TSV test unit A1). As shown in FIG. 2, the first semiconductor chip 100_1A may include the first partial TSV test unit A1, that is a part of the TSV test unit 100 of FIG. 1.

The second semiconductor chip 100_2A may include a TSV state sensor 160A and a TSV selector 180A. The TSV state sensor 160A generates a first signal direction state signal of the TSV unit 90A based on a test output signal, having passed through or output from the TSV unit 90A in the first signal direction. The TSV selector 180A selects at least one of the first to nth TSVs TSV1 through TSVn in the TSV unit 90A as a signal transmission TSV based on the first signal direction state signal. (A configuration including the TSV state sensor 160A and the TSV selector 180A may be referred to as a second partial TSV test unit A2). As shown in FIG. 2, the second semiconductor chip 100_2A may include the second partial TSV test unit A2 that is a part of the TSV test unit 100 of FIG. 1.

As such, the first partial TSV test unit A1 and the second partial TSV test unit A2 of the semiconductor apparatus 10A of the present exemplary embodiment may be distributed in different semiconductor chips, e.g., the first and second semiconductor chips 100_1A and 100_2A. Also, in an exemplary embodiment, each semiconductor chip 100_1A or 100_2A may include a volatile memory such as a dynamic random access memory (DRAM) or a non-volatile memory such as a NAND flash memory.

Figure 3:
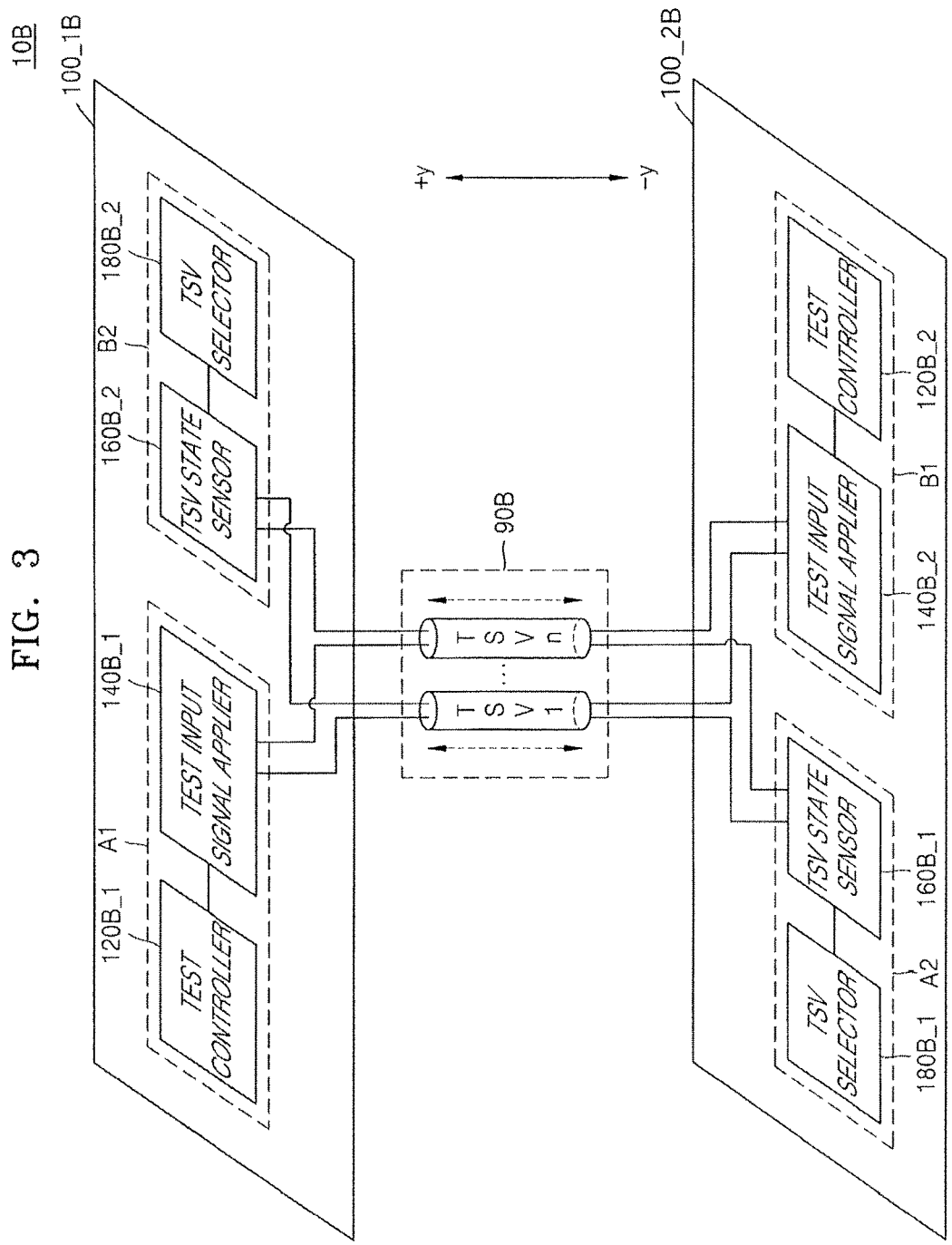
FIG. 3 illustrates another embodiment of a semiconductor apparatus.

FIG. 3 illustrates an embodiment of a semiconductor apparatus 10B including TSV test unit 100. Referring to FIG. 3, the semiconductor apparatus 10B includes a first semiconductor chip 100_1B, a second semiconductor chip 100_2B, and a TSV unit 90B. Referring to FIG. 3, like in FIG. 2, the first semiconductor chip 100_1B may include the first partial TSV test unit A1 and the second semiconductor chip 100_2B may include the second partial TSV test unit A2.

The second semiconductor chip 100_2B may include a test controller 120B_2 and a test input signal applier 140B_2. The test controller 120B_2 controls a test operation in a second signal direction. The test input signal applier 140B_2 applies a second test input signal for testing a signal transmission state of each of the first to nth TSVs TSV1 to TSVn of the TSV unit 90B in the second signal direction. For example, the second signal direction may be a +y direction. The signal transmission state of the TSV unit 90B may be tested by applying the second test input signal from the second semiconductor chip 100_2B to the first semiconductor chip 100_1B. (A configuration including the test controller 120B_2 and the test input signal applier 140B_2 may be referred to as a third partial TSV test unit B1). As shown in FIG. 3, the second semiconductor chip 100_2B may include the third partial TSV test unit B01 that is a part of the TSV test unit 100 of FIG. 1.

The first semiconductor chip 100_1B may include a TSV state sensor 160B_2 and a TSV selector 180B_2. The TSV state sensor 160B_2 generates a second signal direction state signal of the TSV unit 90B based on a test output signal, having passed through or output from the TSV unit 90B in the second signal direction. The TSV selector 180B_2 selects at least one of the first to nth TSVs TSV1 to TSVn of the TSV unit 90B as a signal transmission TSV based on the second signal direction state signal. (A configuration including the TSV state sensor 160B_2 and the TSV selector 180B_2 may be referred to as a fourth partial TSV test unit B2). As shown in FIG. 3, the first semiconductor chip 100_1B may include the fourth partial TSV test unit B2 that is a part of the TSV test unit 100 of FIG. 1.

As such, the semiconductor apparatus 10B of the present exemplary embodiment may test a signal transmission state of the TSV unit 90B by applying a test input signal to the TSV unit 90B in either direction (e.g., in the first direction or the second direction) and receiving a test output signal.

Figure 4A:
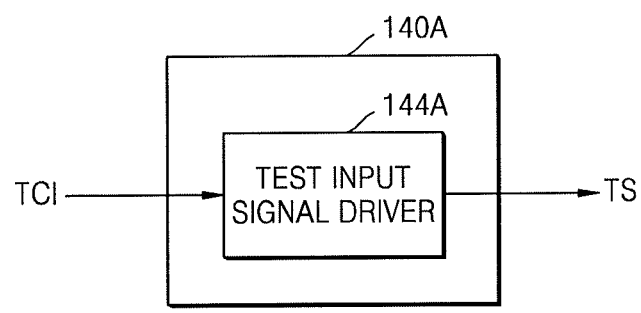
FIGS. 4A and 4B illustrate embodiments of a test input signal applier.
Figure 4B:
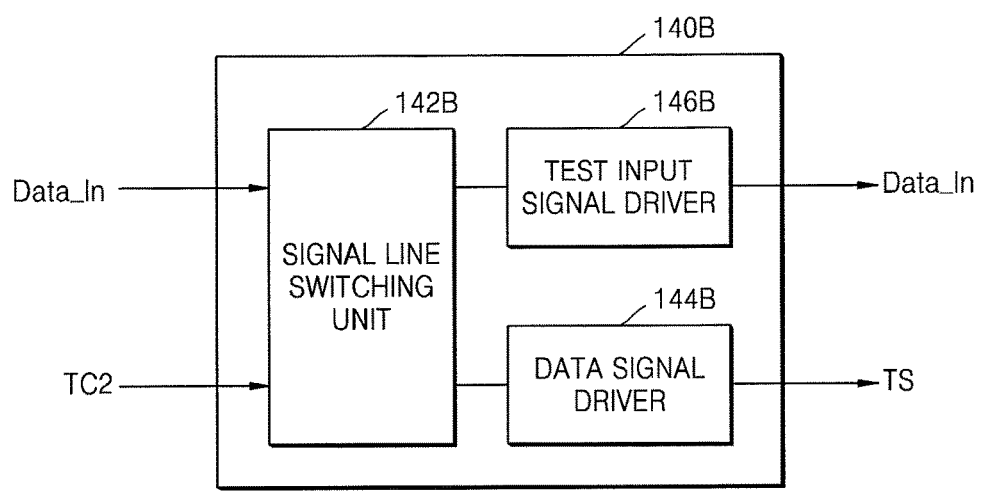

FIGS. 4A and 4B illustrate embodiments of the test input signal applier 140 in FIG. 1. Referring to FIG. 4A, the test input signal applier 140A includes a test input signal driver 144A. When the test input signal applier 140A receives a test command TC1 from the test controller 120 of FIG. 1, the test input signal applier 140A may generate the test input signal TS and apply the test input signal TS to the TSV unit 90.

Referring to FIG. 4B, a test input signal applier 140B includes a signal line switching unit 142B, a test input signal driver 144B, and a data signal driver 146B. The test input signal applier 140B may include a terminal to receive a data signal Data_In through a data signal line from the controller and a terminal to receive a test command TC2 through a test input signal line from the test controller 120 of FIG. 1. When the signal line switching unit 142B receives the test command TC2, the signal line switching unit 142B may perform a switching operation to connect the test input signal line to the test input signal driver 144B. The test input signal driver 144B may apply the test input signal TS to the TSV unit 90 in FIG. 1. Also, when the signal line switching unit 142B receives the data signal Data_In, the signal line switching unit 142B may perform a switching operation to connect the data signal line to the data signal deriver 146B. The data signal driver 146B may apply the data signal Data_In to the TSV unit 90 in FIG. 1.

In this configuration, since the test input signal applier 140B may receive one of the data signal Data_In or the test input signal TC2 and may apply the received signal to the TSV unit 90 in FIG. 1, an operation of transmitting the data signal Data_In as well as a test operation may also be performed. In one embodiment, the test input signal applier 140B may not include the signal line switching unit 142B and may be configured so that the data signal driver 1465B and the test signal driver 144B are individually controlled.

Figure 5:
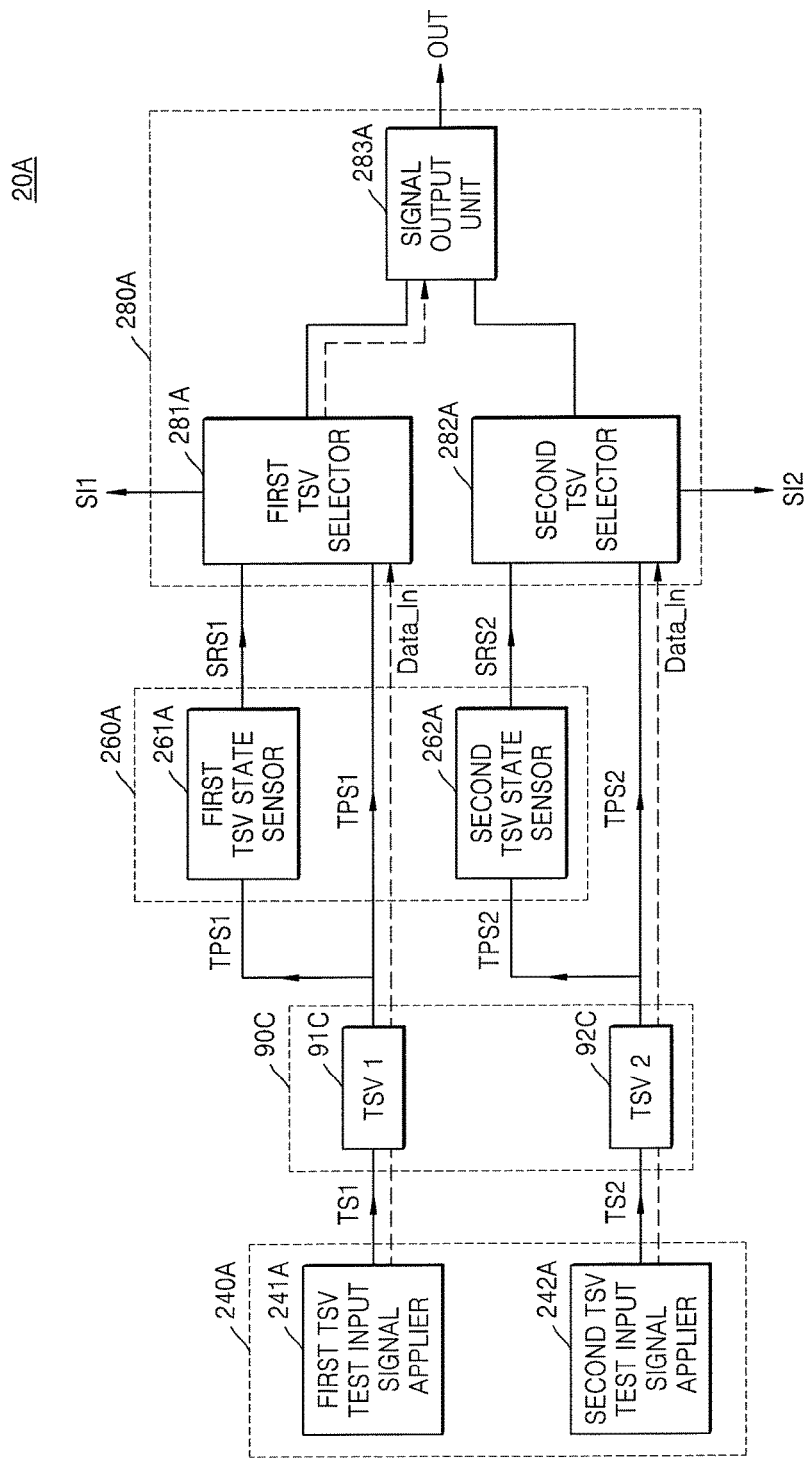
FIG. 5 illustrates an embodiment of a semiconductor apparatus.

FIG. 5 illustrates an embodiment of a semiconductor apparatus 20A which includes a TSV unit 90C, a test input signal applier 240A, a TSV state sensor 260A, and a TSV selector 280A. The TSV unit 90C includes a first TSV 91C and a second TSV 92C. In one embodiment, the TSV unit 90C may include, for example, a plurality of TSVs. The following will be described for the case where the signal transmission state of the first TSV 91C is normal and the signal transmission state of the second TSV 92C is abnormal.

The test input signal applier 240A includes a first TSV test input signal applier 241A and a second TSV test input signal applier 242A. The first TSV test input signal applier 241A applies a first test input signal TS1 to the first TSV 91C. The second TSV test input signal applier 242A applies a second test input signal TS2 to the second TSV 92C. For example, the first test input signal TS1 and the second test input signal TS2 may be pulse signals.

The TSV state sensor 260A includes a first TSV state sensor 261A and a second TSV state sensor 262A. The first TSV state sensor 261A may receive a first test output signal TPS1 from the first TSV 91C. Since the signal transmission state of the first TSV 91C is normal, the first test output signal TPS1 may have a pulse shape that is the same as the first test input signal TS1. The first TSV state sensor 261A may generate a first state signal SRS1 of a first level based on the first test output signal TPS1.

The second TSV state sensor 262A may receive a second test output signal TPS2 from the second TSV 92C. Since the signal transmission state of the second TSV 92C is abnormal, the second test output signal TPS2 may have a pulse shape different from the second test input signal TS2. For example, the second test output signal TPS2 may be a signal of a constant level. The second TSV state sensor 262A may generate a second state signal SRS2 of a second level based on the second test output signal TPS2.

The TSV selector 280A includes a first TSV selector 281A, a second TSV selector 282A, and a signal output unit 283A. The first TSV selector 281A may receive the first state signal SRS1 and determine whether to select the first TSV 91C as a signal transmission TSV based on the first state signal SRS1. As described above, since the first state signal SRS1 has the first level and indicates that the signal transmission state of the first TSV 91C is normal, the first TSV selector 281A may select the first TSV 91C as a signal transmission TSV. The second TSV selector 282A may receive the second state signal SRS2 and determine whether to select the second TSV 92C as a signal transmission TSV based on the second state signal SRS2.

As described above, since the second state signal SRS2 has the second level and indicates that the signal transmission state of the second TSV 92C is abnormal, the second TSV selector 282A may not select the second TSV 92C as a signal transmission TSV. The first TSV selector 281A may generate first selection information SI1 indicating that the first TSV 91C is selected as a signal transmission TSV and may apply the first selection information SD to the test controller 120 of FIG. 1. The second TSV selector 282A may generate second selection information SI2 indicating that the second TSV 92C is not selected as a signal transmission TSV and may apply the second selection information SI2 to the test controller 120 of FIG. 1. The test controller 120 may control a test operation based on the first selection information SI1 and the second selection information SI2. For example, the test controller 120 may repeatedly perform a test operation by adjusting the first and second test input signals TS1 and TS2 based on the first and second selection information SI1 and SI2. For example, test controller 120 may adjust a duty ratio or the like of the first and second test input signals TS1 and TS2.

An example of the flow of the data signal Data_In when the first TSV 91C is selected as a signal transmission TSV by performing a test operation will now be explained. The data signal Data_In (received, e.g., from an external source such as the controller) may be transmitted through the first TSV 91C and may be applied to the first TSV selector 281A. The first TSV selector 281A may apply the data signal Data_In to the signal output unit 283A, because the first TSV 91C is selected as a signal transmission TSV based on the first state signal SRS1. The first TSV state sensor 261A may maintain the first level of the first state signal SRS1, even during an operation of transmitting the data signal Data_In as well as a test operation.

Also, the data signal Data_In received (e.g., as externally received) may be transmitted through the second TSV 92C and may be applied to the second TSV selector 282A. The second TSV selector 282A may not apply the data signal Data_In to the signal output unit 283A because the second TSV 92C is not selected as a signal transmission TSV based on the second state signal SRS2. The second TSV state sensor 262A may maintain the second level of the second state signal SRS2, even during an operation of transmitting the data signal Data_In as well as a test operation. The signal output unit 283C may output the data signal Data_In received through the first TSV 91C as an output signal OUT.

Figure 6:
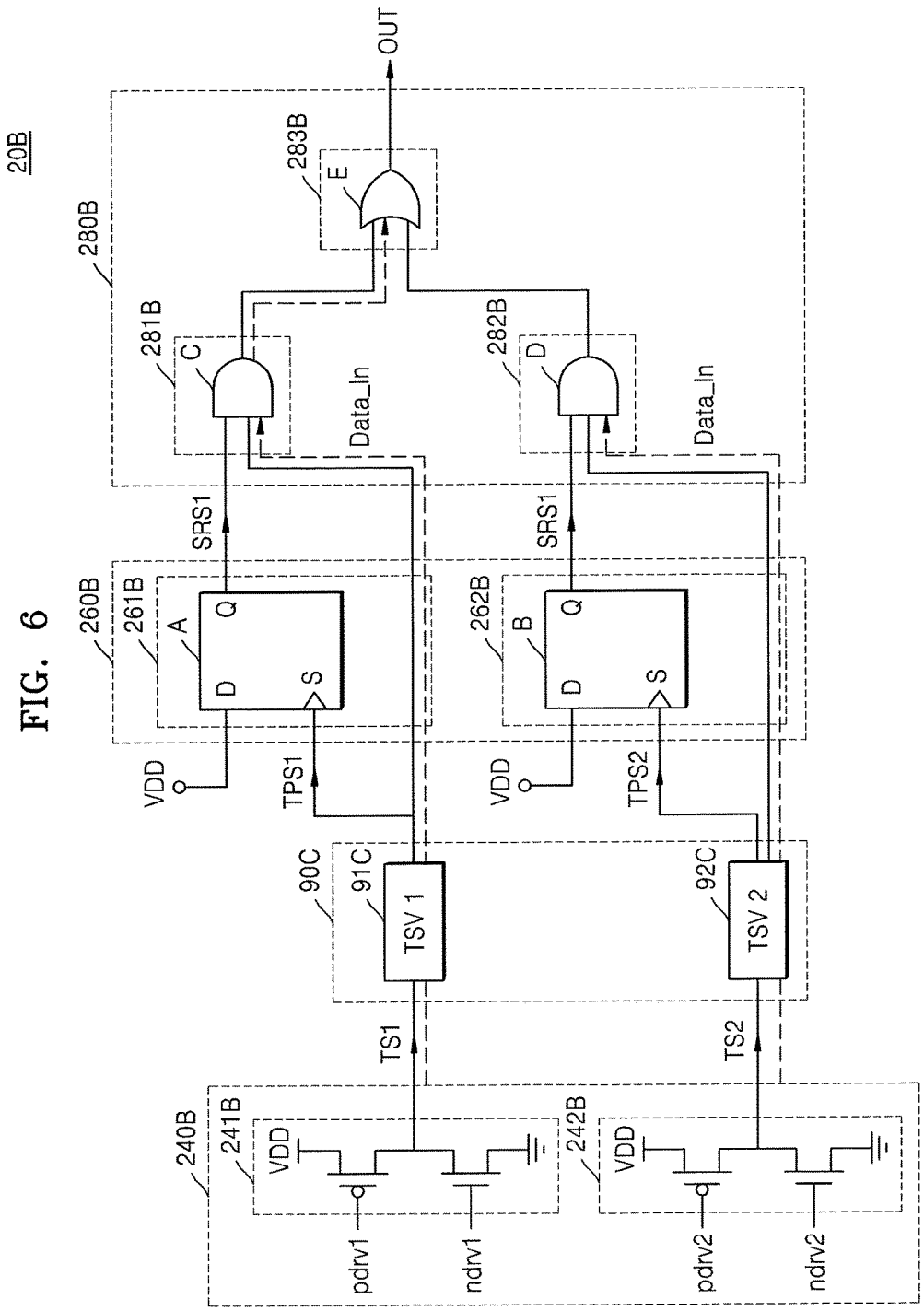
FIG. 6 illustrates an embodiment of a semiconductor apparatus.

FIG. 6 illustrates an embodiment of a semiconductor apparatus 20B. Referring to FIG. 6, a first TSV test input signal applier 241B and a second TSV test input signal applier 242B may include a PMOS and an NMOS. A first TSV state sensor 261B and a second TSV state sensor 262B may include flip-flop circuits A and B. A first TSV selector 281B and a second TSV selector 282B may include AND gate circuits C and D. A signal output unit 283B may include an OR gate circuit E.

Figure 7A:
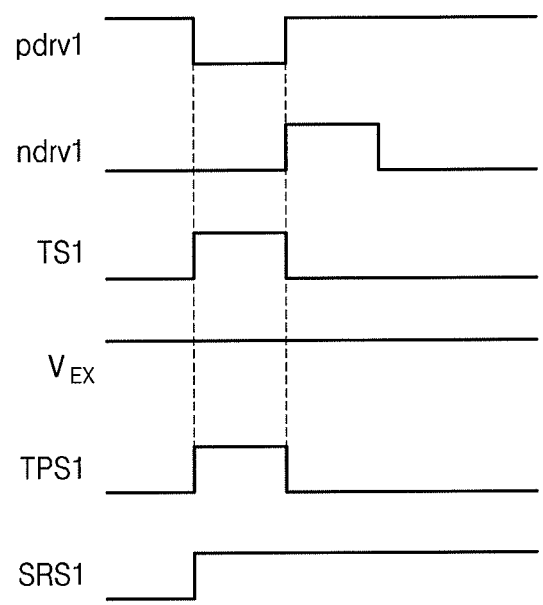
FIGS. 7A and 7B illustrate examples of signal timing diagrams for semiconductor apparatus in FIG. 6.
Figure 7B:
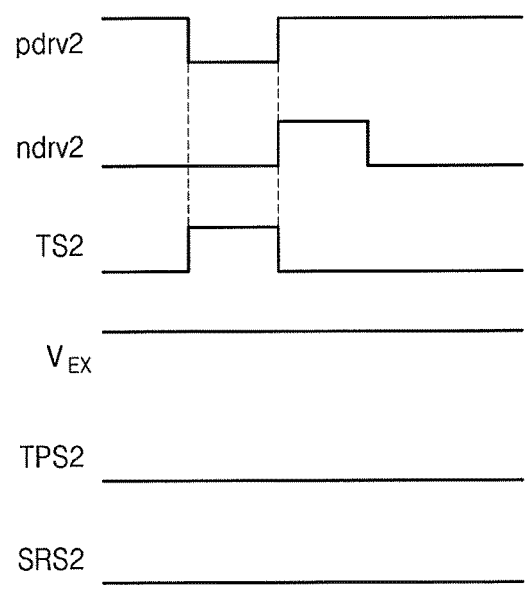

FIGS. 7A and 7B are examples of timing diagrams of signals of the semiconductor apparatus 20B in FIG. 6. Referring to FIGS. 6 and 7A, a pulse signal (such as the first test input signal TS1) may be generated by respectively applying a signal pdrv1 and a signal ndrv1 to the PMOS and the NMOS of the first TSV test input signal applier 241B. The first test output signal TPS1 having passed through the first TSV 91C that is in a normal state may have a pulse shape that is the same as the first test input signal TS1. The flip-flop circuit A of the first TSV state sensor 261B may receive the first test output signal TPS1 through an S terminal. Since a signal $V_{DD}$ received through a D terminal of the flip-flop circuit A corresponds to a high-level signal, the flip-flop circuit A may latch a low-level signal that is latched before a test operation to a high-level signal in response to the first test output signal TPS1 that is a pulse signal, and may output the high-level signal as the first state signal SRS1.

Referring to FIGS. 6 and 7B, a pulse signal such as the second test input signal TS2 may be generated by respectively applying a signal pdrv2 and a signal ndrv2 to the PMOS and the NMOS of the second TSV test input signal applier 242B. Unlike the second test input signal TS2, the second test output signal TPS2, having passed through the second TSV 92C that is in an abnormal state, may be a low-level signal. The flip-flop circuit B of the second TSV state sensor 262B may receive the second test output signal TPS2 through an S terminal. Accordingly, the flip-flop circuit B may output a low-level signal that is latched before a test operation as the second state signal SRS2. An example of the flow of the data signal Data_In after a test operation will now be explained.

Referring to FIG. 6, the data signal Data_In, having passed through the first TSV 91C, may be applied to the first TSV selector 281B. The first TSV selector 281B may receive the first state signal SRS1 of a high level, be activated, and apply the received data signal Data_In to the signal output unit 283B. The data signal Data_In, having passed through the second TSV 92C, may be applied to the second TSV selector 282B. The second TSV selector 282B may receive the second state signal SRS2 of a low level, be inactivated, and block the received data signal Data_In. As such, the TSV selector 280B may select a signal transmission TSV according to a TSV test result.

Figure 8:
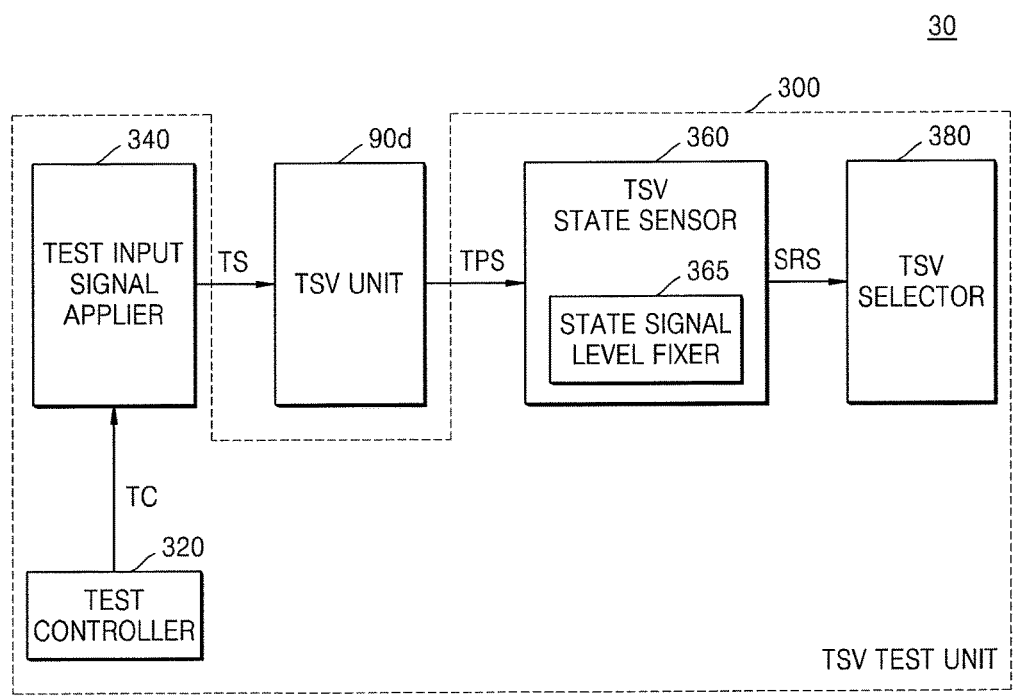
FIG. 8 illustrates an embodiment of a semiconductor apparatus.

FIG. 8 illustrates an embodiment of a semiconductor apparatus 30 which includes a TSV unit 90D and a TSV test unit 300. A TSV state sensor 360 further includes a state signal level fixer 365. Other elements may be the same as in FIG. 1.

The TSV state sensor 360 may receive the test output signal TPS from the TSV unit 90D, sense a signal transmission state of each TSV, and generate the state signal SRS. However, when a data signal is subsequently transmitted, a problem may occur when a level of the state signal SRS is changed due to a wrong operation of the TSV state sensor 360. In order to prevent this problem, the state signal level fixer 360 may fix the level of the state signal SRS based on the state signal SRS as explained below.

Figure 9A:
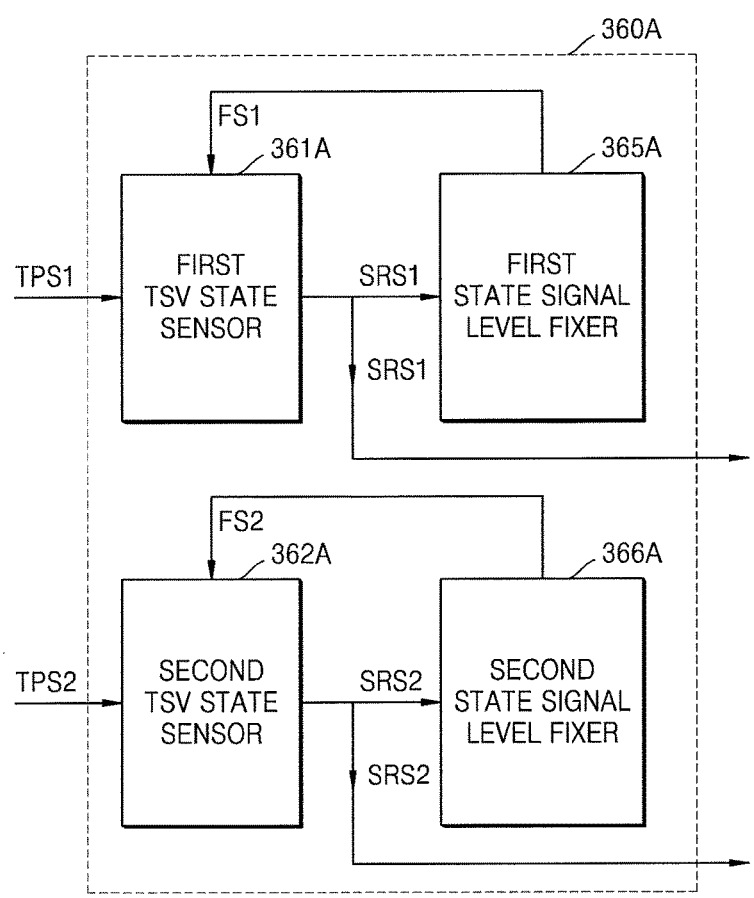
FIG. 9A illustrates an embodiment of a TSV state sensor and FIG. 9B illustrates an embodiment of a circuit diagram of a TSV state sensor.
Figure 9B:
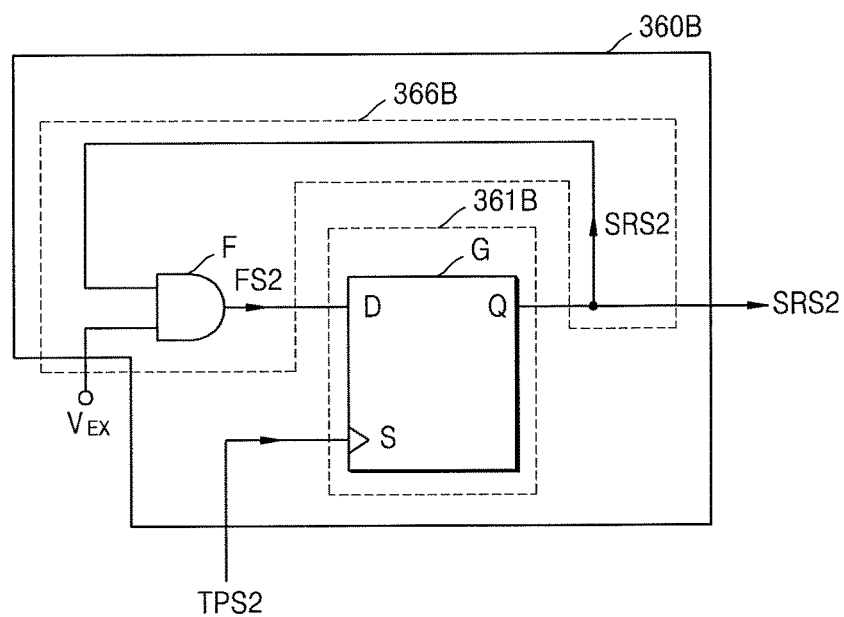

FIG. 9A illustrates an embodiment of a TSV state sensor 360A, and FIG. 9B illustrates an embodiment of a circuit diagram of a TSV state sensor 360B. Referring to FIGS. 5 and 9A, the TSV state sensor 360A includes a first state signal level fixer 365A and a second state signal level fixer 366A, when compared to the TSV state sensor 260A of FIG. 5.

The first state signal level fixer 365A may receive the first state signal SRS1 from a first TSV state sensor 361A, generate a first level fixing signal FS1 based on the first state signal SRS1, and apply the first level fixing signal FS1 to the first TSV state sensor 361A. The first TSV state sensor 361A may fix a level of the first state signal SRS1 in response to the first level fixing signal FS1.

The second state signal level fixer 366A may receive the second state signal SRS2 from a second TSV state sensor 362A, generate a second level fixing signal FS2 based on the second state signal SRS2, and apply the second level fixing signal FS2 to the second TSV state sensor 362A. The second TSV state sensor 362A may fix the level of the second state signal SRS2 in response to the second level fixing signal FS2.

Referring to FIG. 9B, a second state signal level fixer 366B corresponding to the second state signal level fixer 366A of FIG. 9A may include an AND gate F. As described above with reference to FIGS. 5 and 6, for example, a second TSV state sensor 361B may apply the second state signal SRS2 of a low level to the second state signal fixer 366B based on the second test output signal TPS2, having passed through the second TSV in an abnormal state. In this case, the second state signal SRS2 may be fixed to a low level by fixing the second level fixing signal FS2, which is an output of the AND gate F, to a low level. In this configuration, the problem of selecting a second TSV having an abnormal signal transmission state as a signal transmission TSV when the level of the second state signal SRS2 is changed may be prevented.

Figure 10:
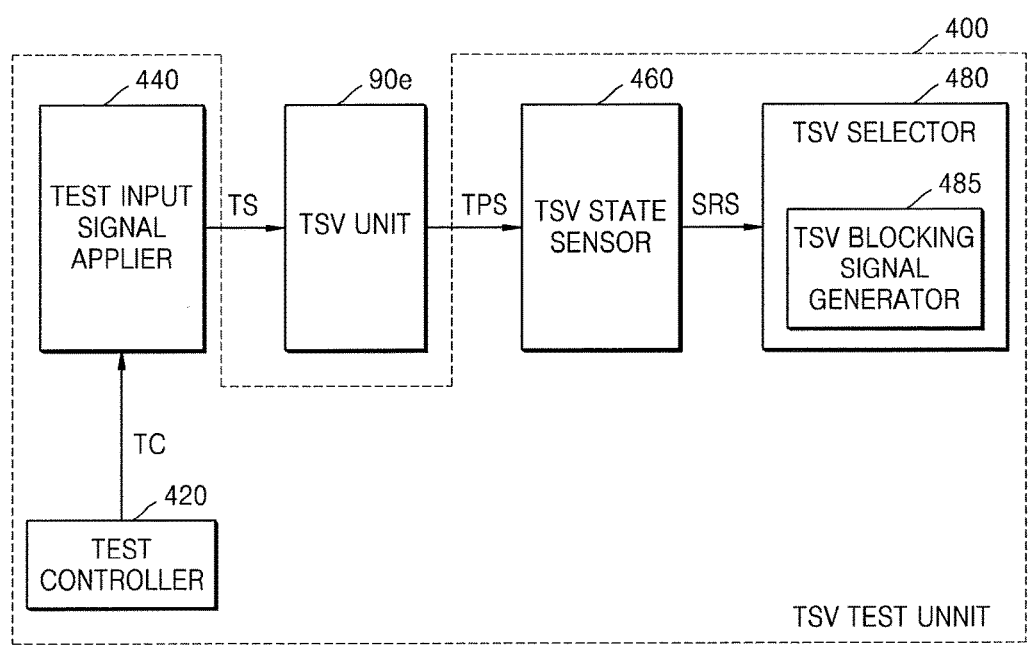
FIG. 10 illustrates an embodiment of a semiconductor apparatus.

FIG. 10 illustrates an embodiment of a semiconductor apparatus 40 which includes a TV unit 90E and a TSV test unit 400. A TSV selector 480 includes a TSV blocking signal generator 485. Other elements may be the same as described above with reference to FIG. 1.

The TSV selector 480 may receive the state signal SRS from a TSV state sensor 460 and select a TSV in a normal state as a signal transmission TSV based on the state signal SRS. However, when the test input signal TS is a pulse signal, the test output signal TPS having passed through a TSV in an abnormal state may be a pulse signal including noise, e.g., timing skew. Accordingly, the TSV state sensor 460 may apply the state signal SRS indicating a normal state to the TSV selector 480 even when the TSV is in the abnormal state. In order to prevent this problem in a test operation, the TSV blocking signal generator 485 may generate a blocking signal for blocking the TSV in the abnormal state based on the state signal SRS as explained below.

Figure 11A:
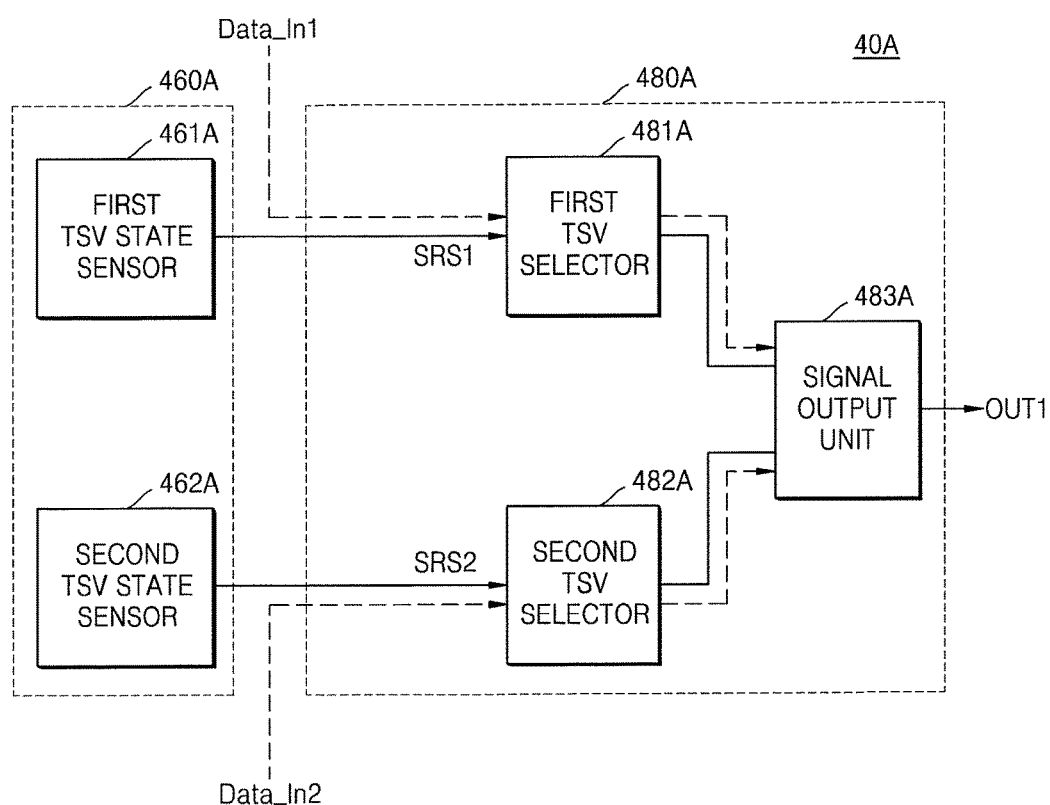
FIGS. 11A to 11C illustrate diagrams for explaining data signals.
Figure 11B:
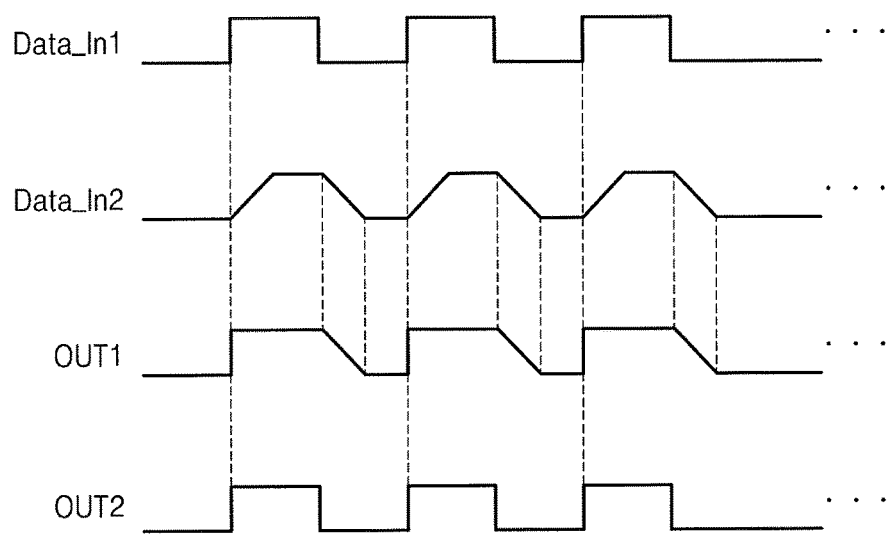
Figure 11C:
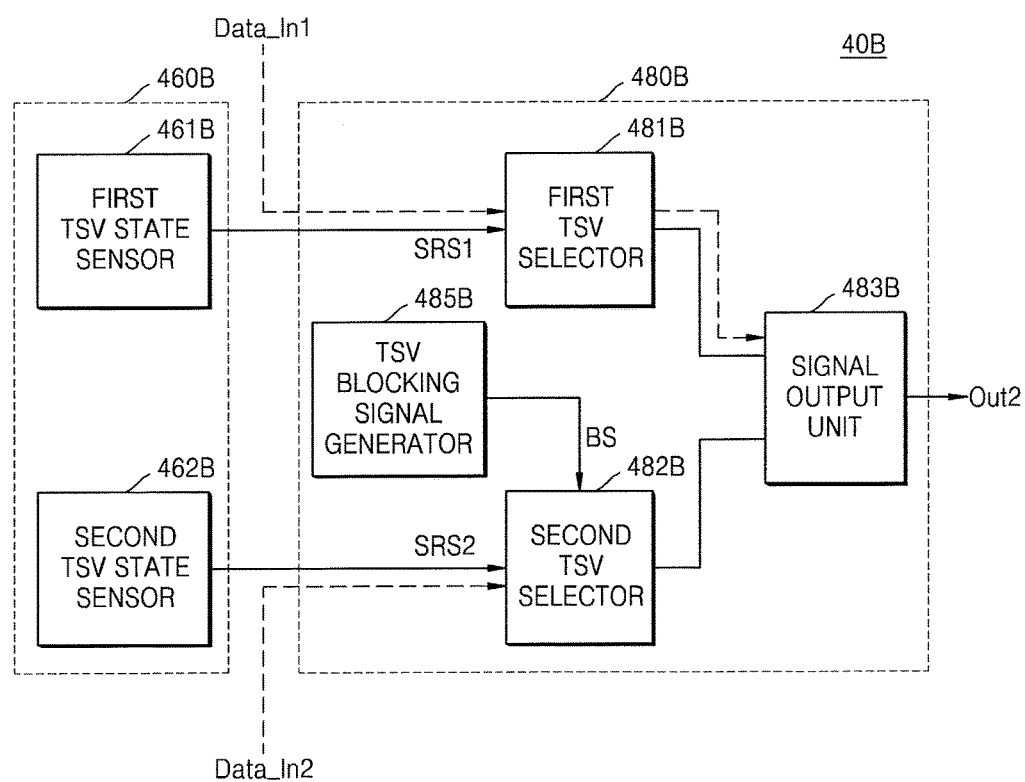

FIG. 11A illustrates an example of the flow of first and second data signals Data_In1 and Data_In2 of a semiconductor apparatus 40A. FIG. 11B is an example of a timing diagram of the first and second data signals Data_In1 and Data_In2 and first and second output signals OUT1 and OUT2. FIG. 11C is an example of a block diagram illustrating the flow of the first and second data signals Data_In1 and Data_In2 of a semiconductor apparatus 40B including a TSV blocking signal generator 485B.

Referring to FIGS. 11A and 11C, first TSV state sensors 461A and 461B and first TSV selector 481A and 481B of FIGS. 11A and 11C respectively correspond to the first TSV state sensor 261A, configured to receive the first test output signal TPS1 from the first TSV 91C that is in a normal state, and the first TSV selector 281A configured to receive the first state signal SRS1 in FIG. 5.

As described above with reference to FIG. 10, when a test output signal having passed through a TSV in an abnormal state is a pulse signal, a second TSV state sensor 462A may apply the second state signal SRS2 (for example, the second state signal SRS2 of a high level) indicating a normal state to a second TSV selector 482A. The second TSV selector 482A may select the second TSV as a signal transmission TSV.

Next, the flow of the first and second data signals Data_In1 and Data_In2 will now be explained with reference to FIGS. 11A and 11C. The first data signal Data_In1 may pass through the first TSV 91C that is in a normal state, pass through the first TSV selector 481A, and then may be applied to a signal output unit 483A. An example of the flow of the second data signal Data_In2 will now be explained.

The second data signal Data_In2 may pass through the second TSV 92C in an abnormal state having a resistance or capacitance higher than the first TSV 91C in a normal state. In this case, as shown in FIG. 11B, the first data signal Data_In1 has a constant pulse width, whereas the second data signal Data_In2 does not have a constant pulse width due to noise such as timing skew. When the first data signal Data_In1 and the second data signal Data_In2 are applied to the signal output unit 483A, the first output signal Out1 output from the signal output unit 483A may not have a constant pulse width due to the effect of the second data signal Data_In2. As a result, an accurate data signal may not be transmitted.

Referring to FIGS. 11B and 11C, in order to prevent this problem, a TSV selector 480B includes the TSV blocking signal generator 485B. The TSV blocking signal generator 485B may receive the first state signal SRS1 and the second state signal SRS2, generate a block signal BS based on the first state signal SRS1 and the second state signal SRS2, and apply the block signal BS to a second TSV selector 482B. The second TSV selector 482B may block the second data signal Data_In2 received from the second TSV 92C in an abnormal state in response to the block signal BS. As a result, as shown in FIG. 11C, only the first data signal Data_In1 may be applied to a signal output unit 483B. The second output signal Out2 output from the signal output unit 483B may have a constant pulse width without being affected by noise.

Figure 12:
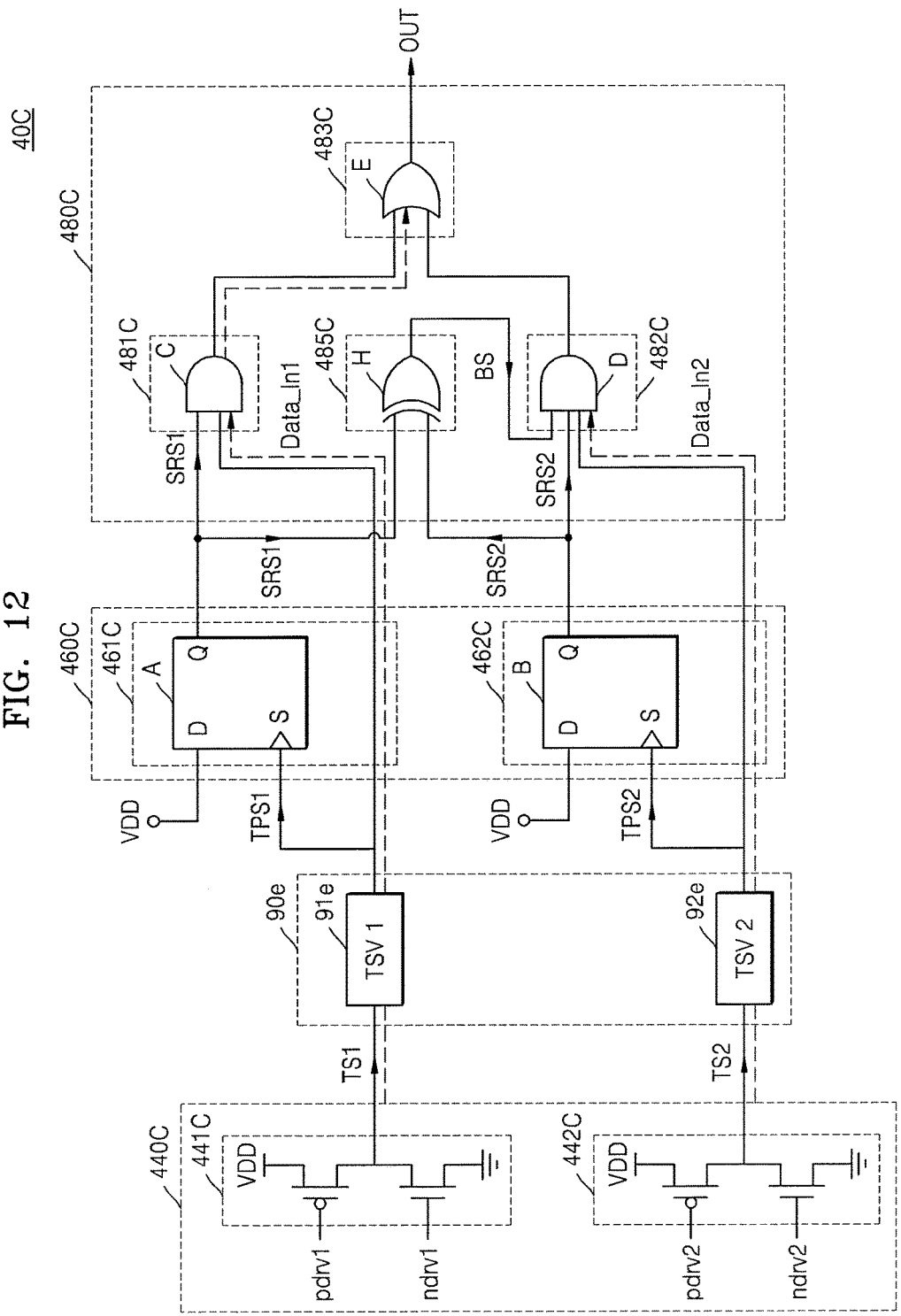
FIG. 12 illustrates a circuit for an embodiment of a semiconductor apparatus.

FIG. 12 is a circuit diagram illustrating an embodiment of the semiconductor apparatus 40 of FIG. 10. Referring to FIG. 12, a TSV blocking signal generator 485C may include an XOR gate circuit C. Other elements may be the same as in FIG. 6. Thus, the following explanation will focus on a configuration including the TSV blocking generator 485C.

First, a first TSV test input signal applier 441C and a second TSV test input signal applier TS2 may respectively apply the first test input signal TS1 and the second test input signal TS2, that are pulse signals, to a first TSV 91e and a second TSV 92e. In this case, it may be assumed that the signal transmission state of the first TSV 91e is normal and the signal transmission state of the second TSV 92e is abnormal. Since the signal transmission state of the second TSV 92e is abnormal, the second test output signal TPS2 including noise (e.g., timing skew) in the second test input signal TS2 may be applied to a second TSV state sensor 462C. However, the second test output signal TPS2 is a pulse signal including noise such as timing skew, the second TSV state sensor 462C may wrongly operate by determining that the signal transmission state of the second TSV 90e is normal.

Accordingly, when the second TSV state sensor 462C receives the second state signal SRS2 of a high level, since a signal $V_{DD}$ corresponds to a high-level signal, the second TSV state sensor 462C including a flip-flop B may apply the second state signal SRS2 of the high level to a second TSV selector 482C and the TSV blocking signal generator 485C. As described above with reference to FIGS. 6 through 7B, a first TSV state sensor 461C configured to sense a state of the first TSV 91e having a normal signal transmission state may apply the first state signal SRS1 of a high level to a first TSV selector 481C and the TSV blocking signal generator 485C.

The TSV blocking signal generator 485C may generate the blocking signal BS based on the first state signal SRS1 and the second state signal SRS2. For example, the TSV blocking signal generator 485C may include an XOR gate circuit D and may apply the blocking signal BS of a low level to the second TSV selector 482C. The second TSV selector 482C may include an AND gate circuit D' including three input terminals. The second TSV selector 482C may block a signal including the second data signal Data_In2 received by the second TSV selector 482C in response to the blocking signal BS of the low level. However, the present exemplary embodiment is not limited thereto, and any of various other configurations may be formed.

Figure 13:
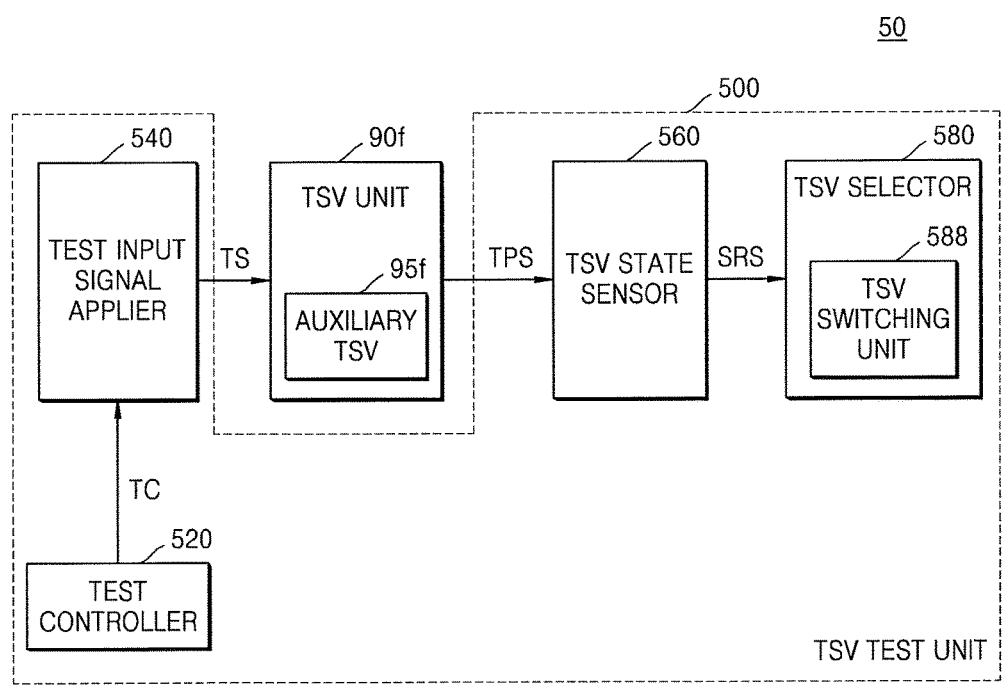
FIG. 13 illustrates another embodiment of a semiconductor apparatus.

FIG. 13 illustrates an embodiment of a semiconductor apparatus 50 which includes a TSV unit 90f and a TSV test unit 500. The TSV unit 90f includes an auxiliary TSV 95f, and a TSV selector 580 includes a TSV switching unit 588. Other elements may be the same as those in FIG. 1.

The TSV unit 90f may include a plurality of TSVs for transmitting signals in the semiconductor apparatus 50. The TSV selector 580 may select a TSV having a normal signal transmission state, from among the plurality of TSVs, as a signal transmission TSV. However, the TSV selected as a signal transmission TSV may happen to have an abnormal signal transmission state due to various factors in the future. In order to deal with this case, the TSV unit 90f may further include the auxiliary TSV 95f selected as a signal transmission TSV. The TSV switching unit 588 may switch a signal transmission TSV from the TSV to the auxiliary TSV 95f as explained below.

Figure 14A:
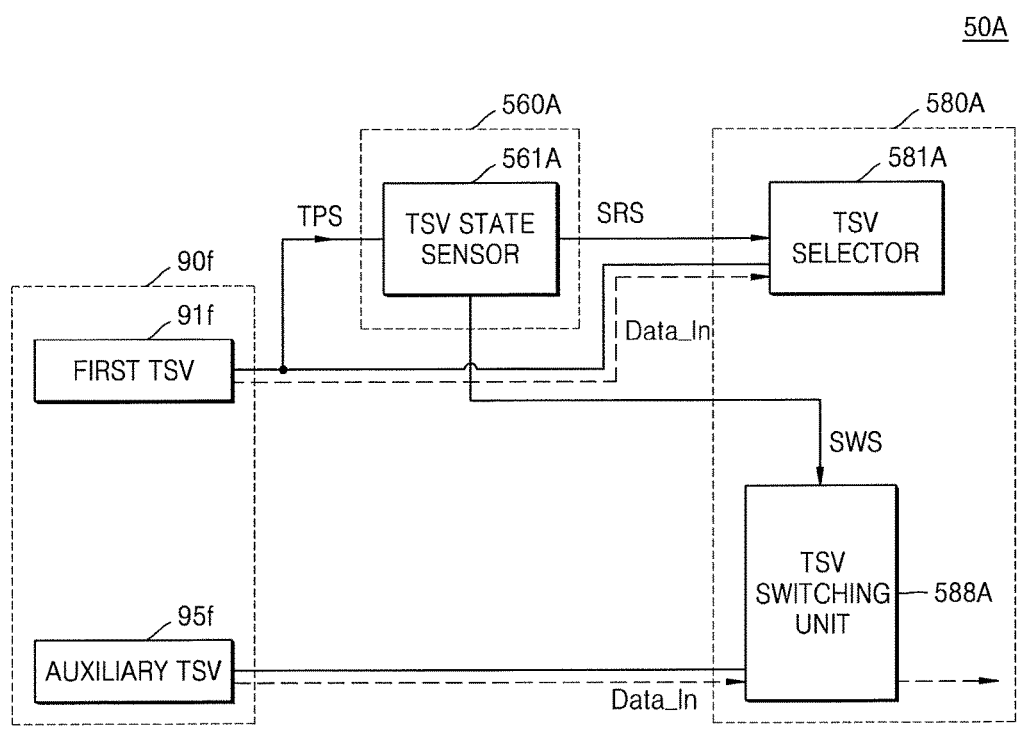
FIGS. 14A to 14D illustrate embodiments of a semiconductor apparatus.
Figure 14B:
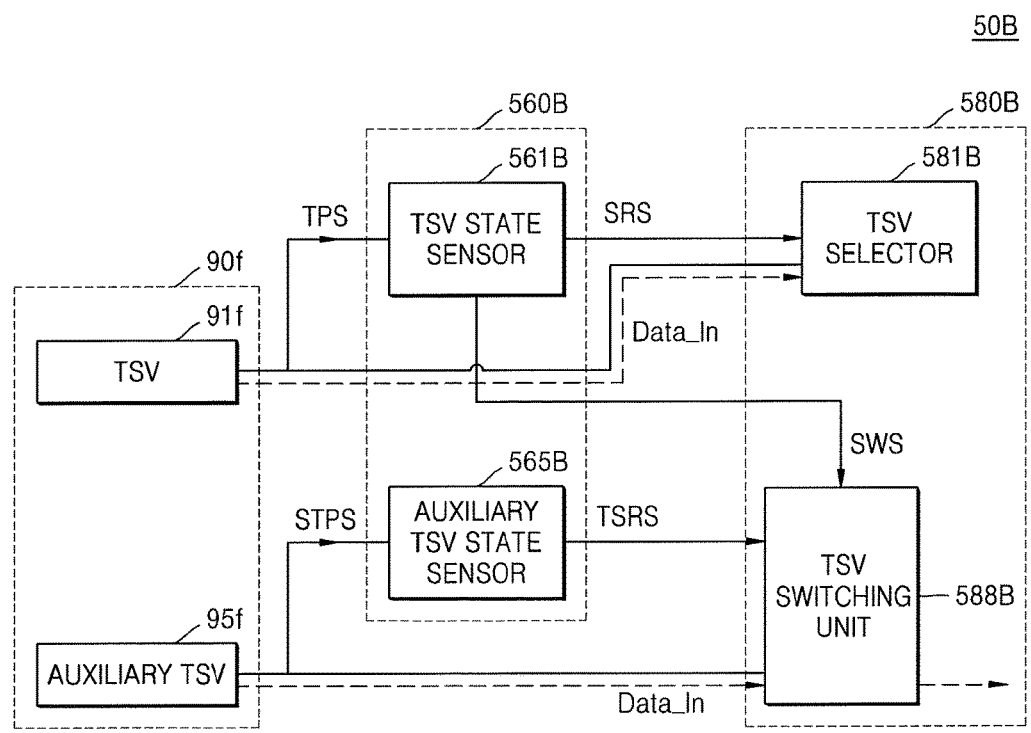
Figure 14C:
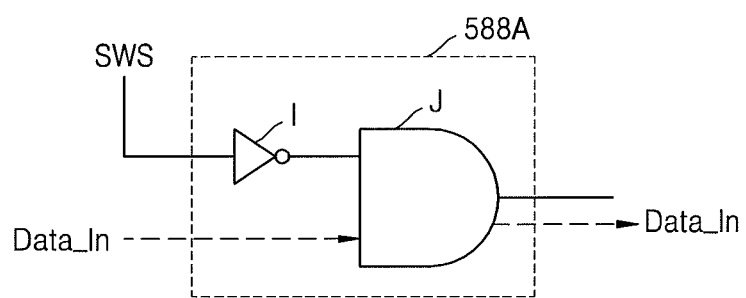
Figure 14D:
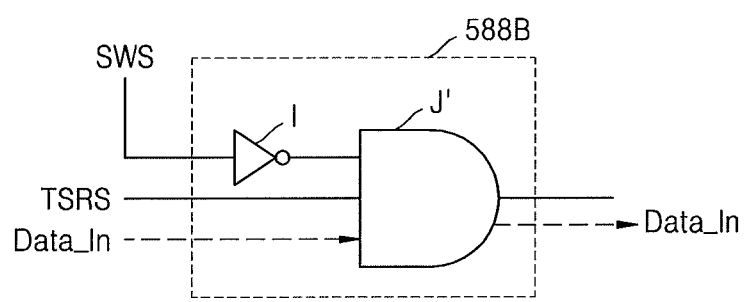

FIGS. 14A and 14B illustrate embodiments of semiconductor apparatuses 50A and 50B, and FIGS. 14C and 14D are circuit diagram embodiments of TSV switching units 588A and 588B.

Referring to FIG. 14A, the semiconductor apparatus 50A includes the TSV unit 90f, a TSV state sensor 560A, and a TSV selector 580A. The TSV unit 90f includes a first TSV 91f and the auxiliary TSV 95f. The TSV state sensor 560A includes a first TSV state sensor 561A to sense a signal transmission state of the first TSV 901f and an auxiliary TSV state sensor 565A to sense a signal transmission state of the auxiliary TSV 95f. The TSV selector 580A includes a first TSV selector 581A and the TSV switching unit 588A.

It may be assumed that, after a signal transmission state of the first TSV 91f is determined to be normal during a first test operation and thus after selection of the first TSV 91f as a signal transmission TSV, the signal transmission state is changed to be abnormal. During a second test operation, when a test input signal applied to the first TSV 91f is a pulse signal, since the signal transmission state of the first TSV 90f is abnormal, the first test output signal TPS1 may be a signal of a predetermined level instead of a pulse signal. Accordingly, the first TSV state sensor 561A may apply the first state signal SRS1 indicating that the signal transmission state of the first TSV 90f is abnormal to the first TSV selector 581A.

Also, the first TSV state sensor 561A may generate a TSV switching control signal SWS based on the signal transmission state of the first TSV 90f and may apply the TSV switching control signal SWS to the TSV switching unit 588A. For example, the first state signal SRS1 and the TSV switching control signal SWS may have the same level. The TSV switching unit 588A may switch between the auxiliary TSV 95f and the first TSV 91f based on the TSV switching control signal SWS and may select the auxiliary TSV 95f as a signal transmission TSV.

After the second test operation, the first TSV selector 581A may block the data signal Data_In having passed through the first TSV 91f having an abnormal signal transmission state. Also, the data signal Data_In, having passed through the auxiliary TSV 95f selected as a signal transmission TSV, may pass through the TSV switching unit 588A.

Referring to FIG. 14B, a TSV state sensor 560B includes a first TSV state sensor 561B and an auxiliary TSV state sensor 565B. During a second test operation of FIG. 14A, the auxiliary TSV state sensor 565B may generate an auxiliary TSV state signal TSRS based on an auxiliary TSV test output signal STPS having passed through the auxiliary TSV 95f. The TSV switching unit 588B may switch between the auxiliary TSV 95f and the first TSV 91f based on the TSV switching control signal SWS and the auxiliary TSV state signal TSRS and may select the auxiliary TSV 95f as a signal transmission TSV. In this configuration, the signal transmission state of the auxiliary TSV 95f may also be tested and the auxiliary TSV 95f may be selected as a signal transmission TSV.

Referring to FIGS. 14A and 14C, the TSV switching unit 588A includes an inverter I and an AND gate circuit J. When the signal transmission state of the first TSV 91f is abnormal, the TSV switching control signal SWS may be a low-level signal such as the first state signal SRS1. The TSV switching control signal SWS may pass through the inverter I to become a high-level signal. Thus, the data signal Data_In may pass through the AND gate signal J.

Referring to FIGS. 14A, 14B, and 14D, the TSV switching unit 588B includes the inverter I and an AND gate circuit J'. When a signal transmission state of the first TSV 91f is abnormal and a signal transmission state of the auxiliary TSV 95f is normal, the TSV switching control signal SWS may be a low-level signal such as the first state signal SRS1. Also, the auxiliary TSV state signal TSRS may be a high-level signal indicating that the signal transmission state of the auxiliary TSV 95f is normal. The TSV switching control signal SWS may pass through the inverter I to become a high-level signal and the auxiliary TSV state signal TSRS is a high-level signal. Thus, the data signal Data_In may pass through the AND gate signal J'. However, circuit configurations of the TSV switching units 588A and 588B are not limited thereto, and any of various other circuit configurations may be formed.

Figure 15:
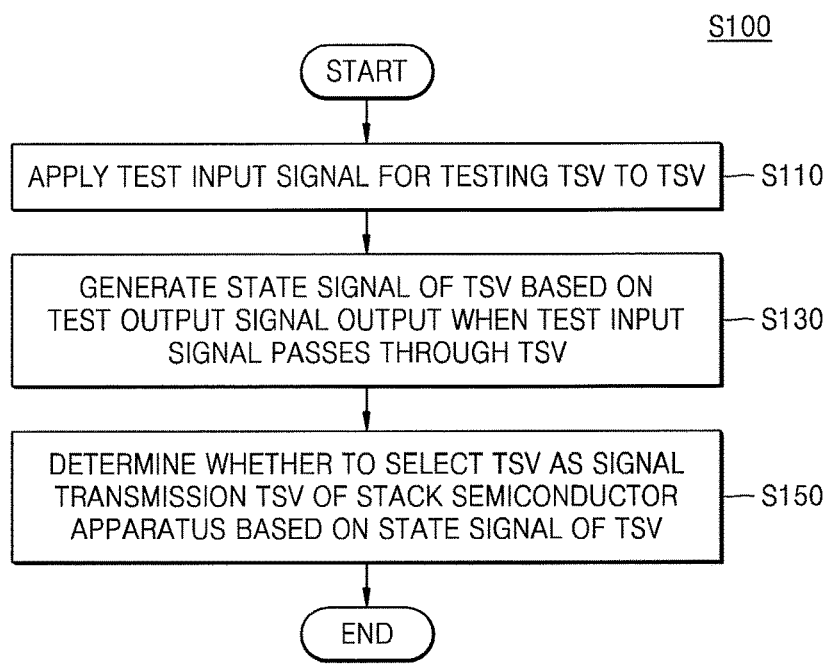
FIGS. 15 to 18 illustrate embodiments of stack semiconductor test methods.

FIG. 15 illustrates an embodiment of a flowchart of a test method S100 of a stack semiconductor apparatus. Referring to FIGS. 1 and 15, the semiconductor apparatus 10 may be, for example, a stack semiconductor apparatus which includes the TSV unit 90 and the TSV test unit 100, like the semiconductor apparatus 10. The TSV test unit 100 includes the test controller 120, the test input signal applier 140, the TSV state sensor 160, and the TSV selector 180.

In operation S110, the TSV test input signal applier 140 applies the test input signal TS for testing each of TSVs of the TSV unit 90 to each TSV. In operation S130, the TSV state sensor 160 generates a state signal SRS based on the test output signal TPS output when the test input signal passes through the TSV. In operation 5150, the TSV selector 150 determines whether the TSV is selected as a signal transmission TSV of the stack semiconductor apparatus based on the state signal SRS.

Also, according to an exemplary embodiment, the test controller 120 may receive a power-on signal for operating the semiconductor apparatus 10 (e.g., from an external source) and may control a test operation of testing the TSV in response to the power-on signal. The test controller 120 may generate the test command TC in order to control a test operation of testing the TSV. The TSV test unit 100 may perform a test operation of the stack semiconductor apparatus in response to the test command TC.

Figure 16:
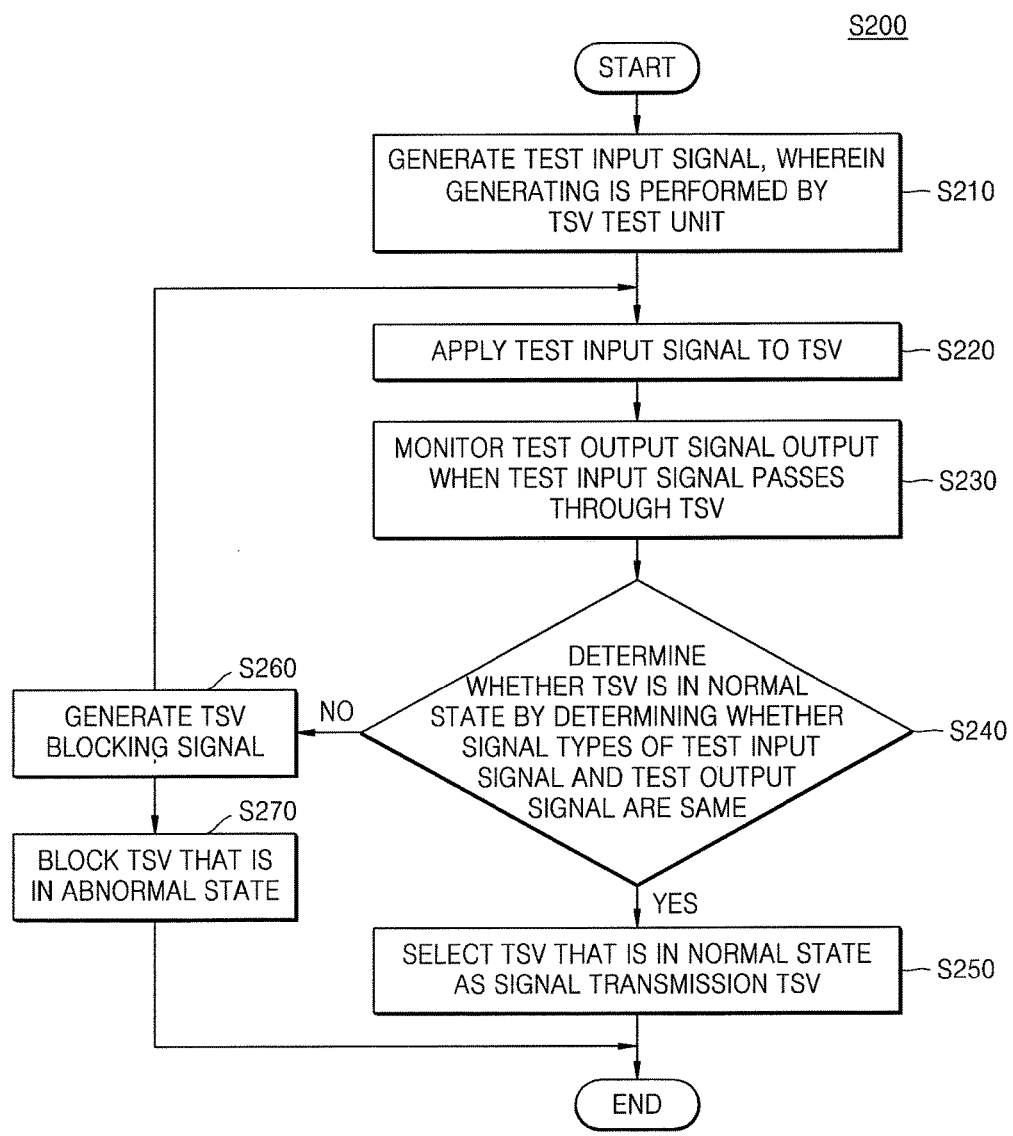

FIG. 16 illustrates an embodiment of a flowchart of a test method 5200 of a stack semiconductor apparatus. Referring to FIGS. 10 and 16, in operation 5210, a TSV test input signal applier 440 generates the test input signal TS. In operation 5220, the TSV test input signal applier 440 applies the generated test input signal TS to a TSV whose signal transmission state is to be determined. In operation 5230, the TSV state sensor 460 monitors the test output signal TPS output when the test input signal TS passes through the TSV.

In operation 5240, the TSV state sensor 460 determines whether a signal transmission state of the TSV is normal by comparing the test input signal TS with the test output signal TPS.

For example, when signal types of the test input signal TS and the test output signal TPS are the same, the TSV state sensor 460 may determine that a signal transmission state of the TSV is normal and may generate the state signal SRS indicating a result of the determination. When signal types of the test input signal TS and the test output signal TPS are different from each other, the TSV state sensor 460 may determine that a signal transmission state of the TSV is abnormal and may generate the state signal SRS indicating a result of the determination.

In operation S250, the TSV selector 480 selects the TSV having a normal signal transmission state as a signal transmission TSV based on the state signal SRS. When it is determined that the signal transmission state of the TSV is abnormal based on the state signal SRS, the test method 5200 proceeds to operation S260. In operation S260, the TSV blocking signal generator 485 generates a TSV blocking signal for blocking signal transmission through the TSV having an abnormal signal transmission state. In operation S270, the TSV selector 480 blocks the TSV having an abnormal signal transmission state based on the TSV blocking signal.

Figure 17:
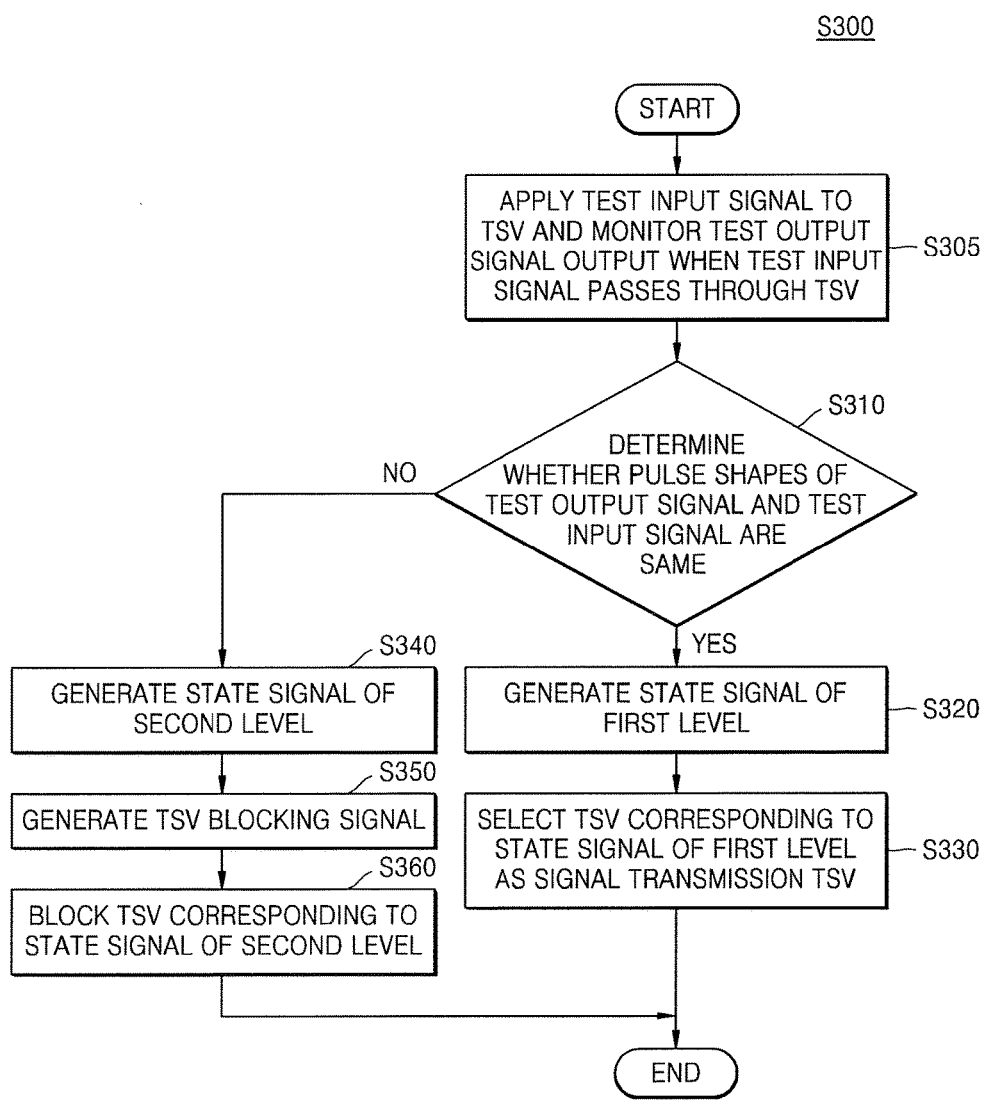

FIG. 17 illustrates an embodiment of a flowchart of a test method S300 of a stack semiconductor apparatus. Referring to FIGS. 7A, 7B, 10, and 17, the first and second test input signals TS1 and TS2 may be pulse signals. In operation S305, the test input signal applier 440 applies the test input signal TS to each TSV, and the TSV state sensor 460 monitors the test output signal TPS output through the TSV.

In operation S310, the TSV state sensor 460 determines whether pulse shapes of the first and second test output signals TPS1 and TPS2 are the same as the first and second test input signals TS1 and TS2. Since the first test output signal TPS1 is a signal having a pulse shape that is the same as that of the first test input signal TS1, the test method S300 proceeds to operation S320.

In operation S320, the TSV state sensor 460 generates the state signal SRS1 of a first level. For example, the first level may be a high level.

In operation S330, the TSV selector 480 selects a TSV corresponding to the state signal SRS1 of the first level as a signal transmission TSV based on the state signal SRS1 of the first level. Also, since the second test output signal TPS2 is a signal having a pulse shape different from that of the second test input signal TS2, the test method S300 proceeds to operation S340.

In operation S340, the TSV state sensor 460 generates the state signal SRS2 of a second level. For example, the second level may be a low level.

In operation 5350, the TSV blocking signal generator 485 generates a TSV blocking signal based on the state signal SRS2 of the second level.

In operation S360, the TSV selector 480 blocks a TSV corresponding to the state signal SRS2 of the second level based on the TSV blocking signal. Furthermore, the TSV state signal level fixer 365 of FIG. 8 may generate a level fixing signal for fixing a level of each signal based on the state signal SRS1 of the first level and the state signal SRS2 of the second level. The TSV state sensor 360 may fix the state signal SRS1 of the first level to the first level and may fix the state signal SRS2 of the second level to the second level in response to the level fixing signal.

Figure 18:
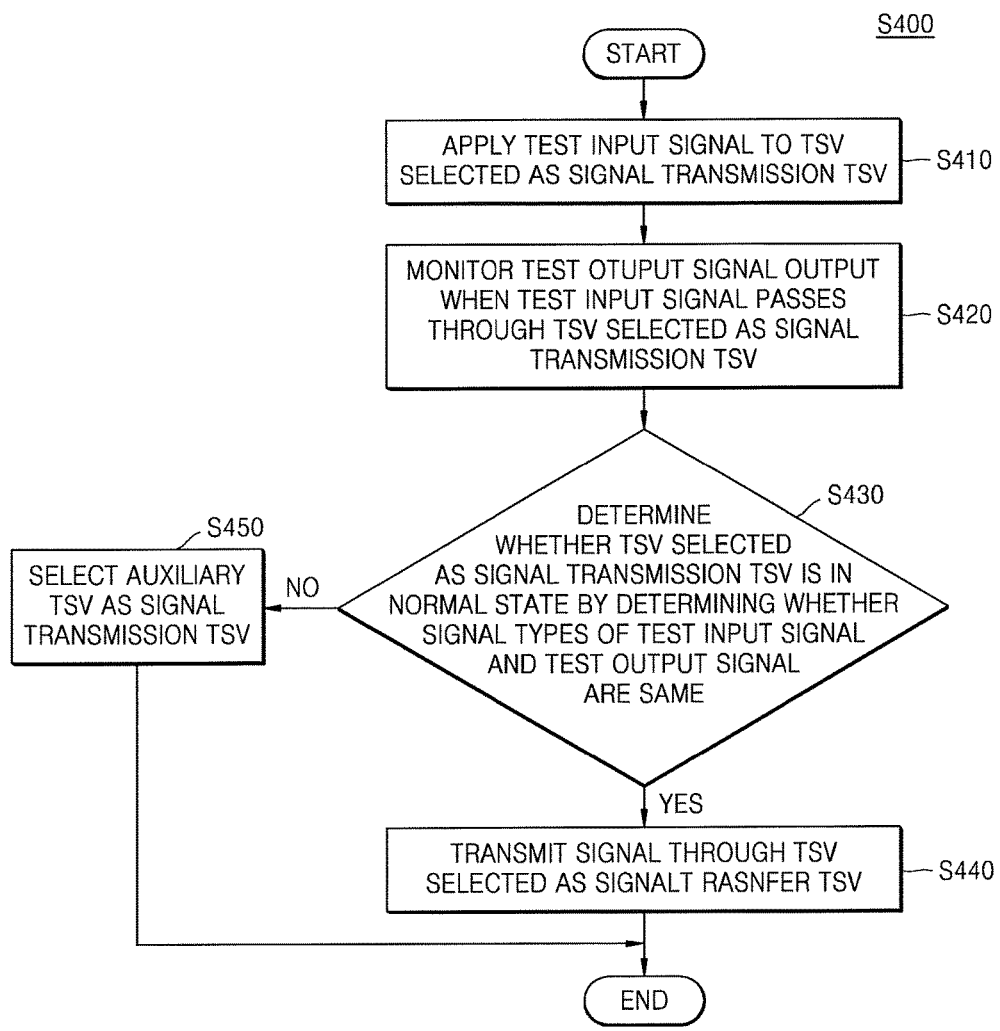

FIG. 18 illustrates an embodiment of a flowchart of a test method S400 of a stack semiconductor apparatus. Referring to FIGS. 13 and 18, in operation S410, a test input signal applier 540 applies the test input signal TS to a TSV selected as a signal transmission TSV.

In operation S420, a TSV state sensor 560 monitors the test output signal TPS output when the test input signal TS passes through the TSV selected as a signal transmission TSV.

In operation S430, the TSV state sensor 560 determines whether a signal transmission state of the TSV selected as a signal transmission TSV is normal by determining whether signal types of the test input signal TS and the test output signal TPS are the same. When it is determined that the signal transmission state of the TSV selected as a signal transmission TSV is normal, a signal may be transmitted between the controller and the stack semiconductor apparatus through the TSV selected as a signal transmission TSV. When it is determined that the signal transmission state of the TSV selected as a signal transmission TSV is abnormal, the test method S400 proceeds to operation S450.

In operation S450, an auxiliary TSV, instead of the TSV selected as a signal transmission TSV, is selected as a signal transmission TSV. For example, the TSV selector 580 may control the TSV switching unit 588 to switch between the TSV selected as a signal transmission TSV and the auxiliary TSV and may select the auxiliary TSV as a signal transmission TSV.

Figure 19:
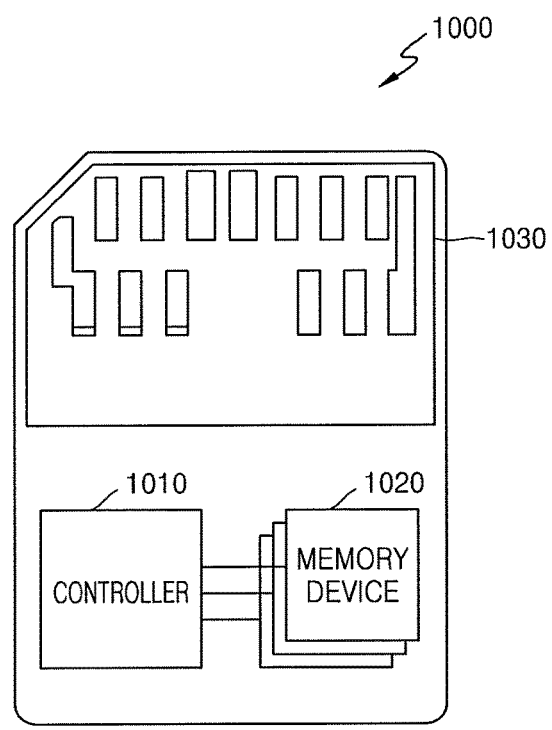
FIG. 19 illustrates an embodiment of a memory card.

FIG. 19 illustrates an embodiment of a memory card 1000, which may be a portable storage device connected, for example, to an electronic device such as a mobile device or a desktop computer. As shown in FIG. 19, the memory card 1000 may include a memory controller 1010, a memory device 1020, and a port area 1030. The memory card 1000 may communicate with an external host through the port area 1030 and the memory controller 1010 may control the memory device 1020. The memory controller 1010 may operate by reading a program that is stored in a ROM. The memory device 1020 may correspond to the semiconductor apparatus 10 of FIG. 1 and may test a signal transmission state of each of TSVs that connect semiconductor chips and may select a TSV to be used as a signal transmission TSV, thereby accurately and efficiently transmitting a data signal.

Figure 20:
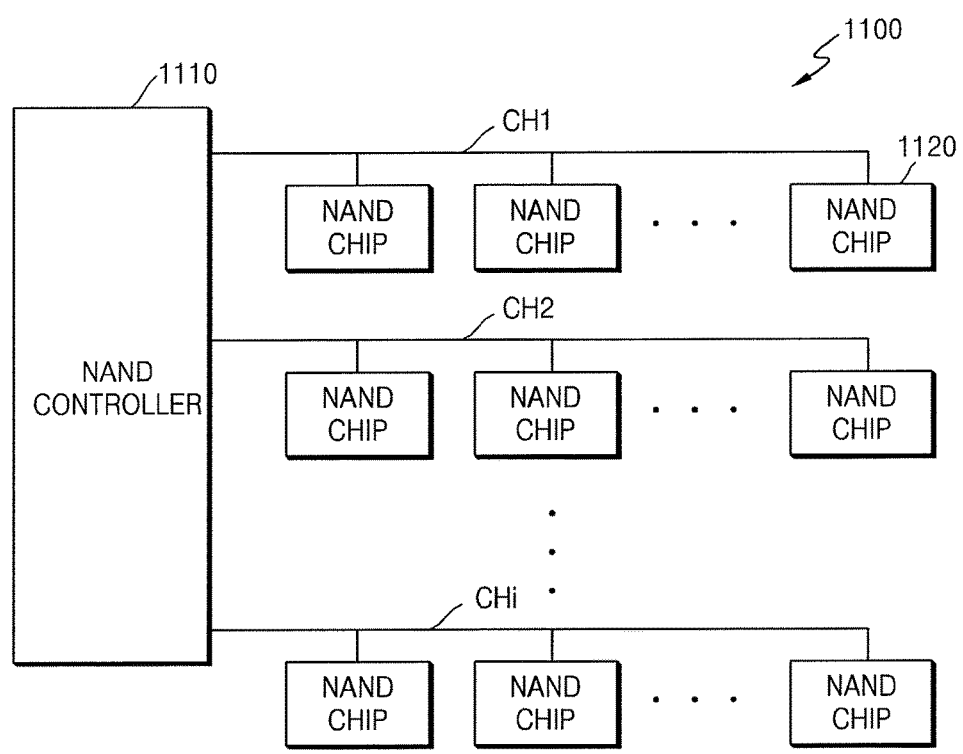
FIG. 20 illustrates an embodiment of a solid-state device.

FIG. 20 illustrates an embodiment of a solid-state device (SSD) 1100 which includes a NAND controller 1110 and a plurality of NAND chips 1120. The NAND controller 1110 may control the plurality of NAND chips 1120 connected to channels CH1, CH2, . . . and CHi. The NAND controller 1110 may correspond to the semiconductor apparatus 10 of FIG. 1, and may test a signal transmission state of each of TSVs that connect a plurality of semiconductor chips and may select a TSV to be used as a signal transmission TSV, thereby accurately and efficiently transmitting a data signal.

Figure 21:
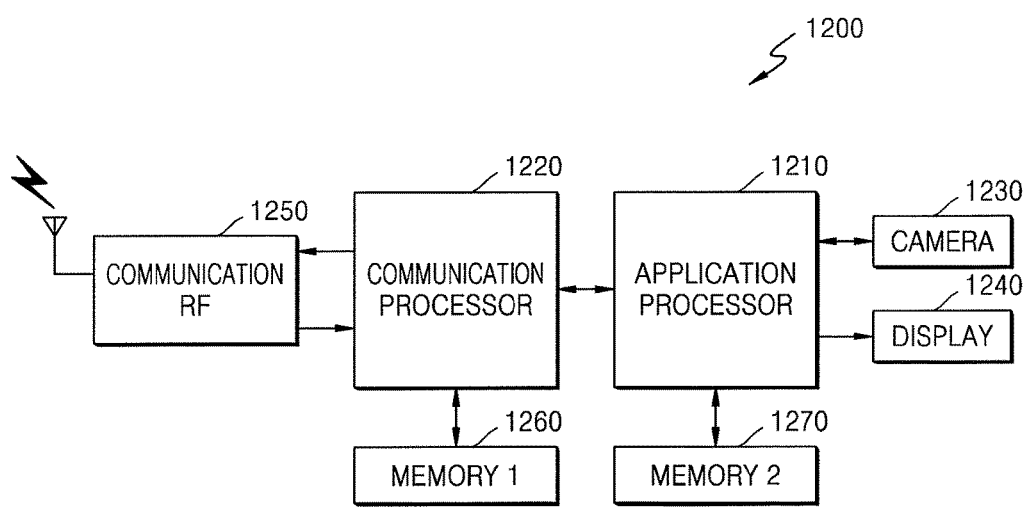
FIG. 21 illustrates an embodiment of a mobile device.

FIG. 21 illustrates an embodiment of a mobile device 1200 which includes an application processor 1210 provided as a system on chip (SOC), a communication processor 1220, a camera 1230, a display 1240, a communication radio frequency (RF) 1850, and first and second memories 1260 and 1270. An application may be executed by the application processor 1210 in the mobile device 1200. For example, when an image is captured by the camera 1230, the application processor 1210 may store the captured image in the second memory 1270 and may display the stored image on display 1240.

The application processor 1210 may correspond to the semiconductor apparatus 10 of FIG. 1 and may test a signal transmission state of each of TSVs that connect semiconductor chips and may select a TSV to be used as a signal transmission TSV, thereby accurately and efficiently transmitting a data signal. The captured image may be transmitted to the outside through the communication RF 1250 under the control of the communication processor 1220. In this case, the communication processor 1220 may temporarily store the image in the first memory 1260 to transmit the image. The communication processor 1220 may control communication for data transmission/reception and phone conversation.

Figure 22:
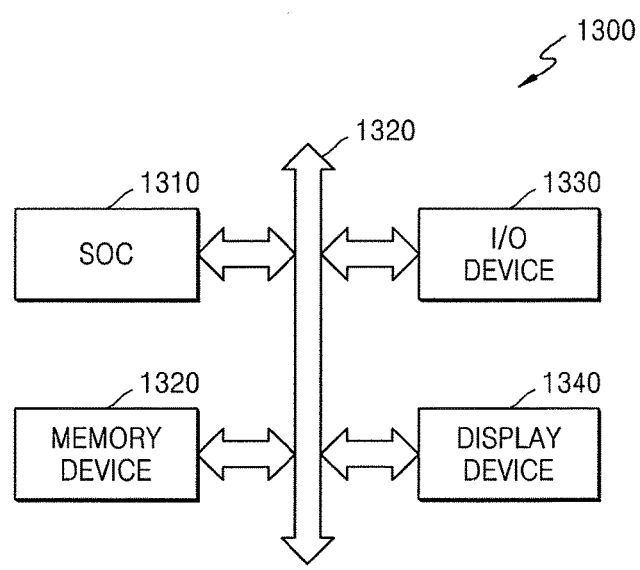
FIG. 22 illustrates an embodiment of a computing system.

FIG. 22 illustrates an embodiment of a computing system 1300, which, for example, may be a mobile device, a desktop computer, or a server. The computing system 1300 may include an SOC 1310, a memory device 1320, an input/output device 1330, and a display device 1340 connected to a bus 1350. The SOC 1310 may correspond to the semiconductor apparatus 10 of FIG. 1, and may test a signal transmission state of each of TSVs that connect semiconductor chips and may select a TSV to be used as a signal transmission TSV, thereby accurately and efficiently transmitting a data signal.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The appliers, controllers, units, selectors, and other processing and control features of the embodiments described herein may be implemented in logic which, for example, may include hardware, software, or both. When implemented at least partially in hardware, the appliers, controllers, units, selectors, and other processing and control features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the appliers, controllers, units, selectors, and other processing and control features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor apparatus, comprising:
    two or more semiconductor chips electrically connected through one or more through-silicon vias (TSVs); and
    a TSV tester on at least one of the two or more semiconductor chips, the TSV tester to test a state of each of the one or more TSVs based on a signal output through each of the one or more TSVs and to determine whether to use a TSV among the one or more TSVs as a signal transmission TSV based on the state of the TSV,
    wherein the TSV tester includes:
        a TSV state sensor to generate a state signal corresponding to the state of each of the one or more TSVs based on a test output signal, the test output signal to be output when a test input signal to test each of the one or more TSVs passes through each of the one or more TSVs; and
        a TSV selector to select at least one of the one or more TSVs as the signal transmission TSV based on the state signal,
    wherein the TSV state sensor is to determine whether each of the one or more TSVs is in a normal state based on whether signal types of the test input signal and the test output signal are equal, and
    wherein:
        the test input signal is a pulse signal, and
        the TSV state sensor is to determine whether the test output signal has a pulse shape equal to a pulse shape of the test input signal and is to generate a state signal of a first level when the pulse shapes of the test output signal and the test input signal are equal, the TSV state sensor to generate a state signal of a second level when the pulse shape of the test output signal is different from the pulse shape of the test input signal.

2. The apparatus as claimed in claim 1, wherein the TSV selector is to select a TSV corresponding to the state signal of the first level from among the one or more TSVs as the signal transmission TSV.

3. The apparatus as claimed in claim 1, further comprising:
    one or more auxiliary TSVs to transmit the signal instead of the TSV selected as the signal transmission TSV, wherein the TSV tester is to test the state of the TSV selected as the signal transmission TSV and to switch between the TSV selected as the signal transmission TSV and an auxiliary TSV among the one or more auxiliary TSVs based on the state of the TSV selected as the signal transmission TSV.

4. A method for testing a stack semiconductor apparatus electrically connected through one or more through-silicon vias (TSVs), the method comprising:
    applying a test input signal, to test each of the one or more TSVs, to each of the one or more TSVs;
    generating a state signal of each of the one or more TSVs based on a test output signal output when the test input signal passes through each of the one or more TSVs; and determining whether to select a TSV from among the one or more TSVs as a signal transmission TSV of the stack semiconductor apparatus based on the state signal, wherein generating the state signal of each of the one or more TSVs includes:

monitoring the test output signal; and determining whether each of the one or more TSVs is in a normal state based on a comparison of signal types of the test input signal and the test output signal, wherein determining whether each of the one or more TSVs is in a normal state includes determining whether the signal types of the test output signal and the test input signal are equal, and wherein generating the state signal of each of the one or more TSVs includes generating a state signal indicating a normal state when the signal types of the test output signal and the test input signal are equal.

5. The method as claimed in claim 4, wherein determining whether to select the TSV from among the one or more TSVs as the signal transmission TSV includes selecting a TSV corresponding to the state signal indicating the normal state as the signal transmission TSV.

6. The method as claimed in claim 4, wherein, when a TSV among the one or more TSVs is determined to be in an abnormal state based on a comparison of the signal types of the test input signal and the test output signal, the method includes:

generating a TSV blocking signal to block signal transmission through the TSV determined to be in the abnormal state; and blocking the TSV determined to be in the abnormal state based on the TSV blocking signal.

7. The method as claimed in claim 4, further comprising:
receiving a power-on signal; and
generating a test command to test each of the one or more TSVs based on the power-on signal.

8. The method as claimed in claim 4, further comprising:
applying the test input signal to the TSV selected as the signal transmission TSV;
monitoring the test output signal output when the test input signal passes through the TSV selected as the signal transmission TSV; and
determining whether the TSV selected as the signal transmission TSV is in a normal state based on a comparison of signal types of the test input signal and the test output signal output through the TSV selected as the signal transmission TSV.

9. The method as claimed in claim 8, wherein:
the one or more TSVs include auxiliary TSVs, and
the method includes, when the TSV selected as the signal transmission TSV is in an abnormal state, selecting, instead of the TSV selected as the signal transmission TSV, an auxiliary TSV from among the auxiliary TSVs as the signal transmission TSV.

10. The method as claimed in claim 4, further comprising:
generating a level fixing signal based on the state signal; and
fixing a level of the state signal to a previous level based on the level fixing signal.

11. A semiconductor apparatus, comprising:
first and second through-silicon vias (TSVs);
a tester to select the second TSV as a signal transmission TSV when the first TSV is in an abnormal state, wherein the first and second TSVs electrically connect two semiconductor chips; and
one or more auxiliary TSVs to transmit a signal instead of the second TSV selected as the signal transmission TSV, wherein the tester is to test the state of the second TSV selected as the signal transmission TSV and to switch between the second TSV selected as the signal transmission TSV and an auxiliary TSV among the one or more auxiliary TSVs based on the state of the second TSV selected as the signal transmission TSV.

12. The apparatus as claimed in claim 11, wherein the tester is to test a state of the first TSV based on a signal output from the first TSV.

13. The apparatus as claimed in claim 12, wherein the tester is to determine that the first TSV is in the abnormal state when the signal output from the first TSV is different from a test signal input into the first TSV.

14. The apparatus as claimed in claim 13, wherein the tester is to determine that the first TSV is in the abnormal state when a shape or level of the signal output from the first TSV is determined to be different from a shape or level of the test signal input into the first TSV.

15. The apparatus as claimed in claim 11, further comprising:
a selector to select among the first TSV and the second TSV such that a data signal may be applied to the first TSV or the second TSV.

* * * * *